US009741631B2

(12) United States Patent
Kanamori

(10) Patent No.: US 9,741,631 B2
(45) Date of Patent: Aug. 22, 2017

(54) SUBSTRATE STORAGE CONTAINER WITH HANDLING MEMBERS

(71) Applicants: Miraial Co., Ltd., Tokyo (JP); SHIN-ETSU POLYMER CO., LTD., Tokyo (JP)

(72) Inventor: Yuta Kanamori, Tokyo (JP)

(73) Assignees: MIRAIAL CO., LTD., Tokyo (JP); SHIN-ETSU POLYMER CO., LTD., Tokyo (JP)

( * ) Notice: Subject to any disclaimer, the term of this patent is extended or adjusted under 35 U.S.C. 154(b) by 0 days.

(21) Appl. No.: 14/893,817

(22) PCT Filed: May 29, 2013

(86) PCT No.: PCT/JP2013/064948
§ 371 (c)(1),
(2) Date: Nov. 24, 2015

(87) PCT Pub. No.: WO2014/192109
PCT Pub. Date: Dec. 4, 2014

(65) Prior Publication Data
US 2016/0104649 A1    Apr. 14, 2016

(51) Int. Cl.
*H01L 23/04* (2006.01)
*H01L 21/673* (2006.01)
(Continued)

(52) U.S. Cl.
CPC ........ *H01L 23/04* (2013.01); *H01L 21/67379* (2013.01); *H01L 23/13* (2013.01); *H01L 23/32* (2013.01); *H01L 2924/0002* (2013.01)

(58) Field of Classification Search
CPC ....... B65D 85/00; B65D 85/30; H01L 21/673; H01L 21/67379; H01L 23/04; H01L 23/13; H01L 23/32; H01L 2924/0002
(Continued)

(56) References Cited

U.S. PATENT DOCUMENTS

2008/0251415 A1   10/2008  Yamagishi et al.
2012/0325707 A1   12/2012  Ogawa
(Continued)

FOREIGN PATENT DOCUMENTS

EP    1004524       5/2000
JP    2002231802    8/2002
(Continued)

*Primary Examiner* — Bryon Gehman
(74) *Attorney, Agent, or Firm* — Muncy, Geissler, Olds & Lowe, P.C.

(57) ABSTRACT

A handling member includes: a substantially plate-like handling member main body that is arranged along a pair of the side walls, respectively; a circular position-restriction through hole that is formed to extend through the handling member main body in a thickness direction of the handling member and with which the semicircular convex portion can be engaged; a handling member side guided portion that is engaged with the guide members and of which a movement is guided between the mounting position and the detachment position by the guide members; and a back-side guided portion that can be engaged with the back-side engaging portion by a movement of the handling member from the detachment position to the mounting position.

6 Claims, 18 Drawing Sheets

(51) Int. Cl.
*H01L 23/13* (2006.01)
*H01L 23/32* (2006.01)
(58) Field of Classification Search
USPC .............................. 206/454, 710, 711, 723
See application file for complete search history.

(56) References Cited

U.S. PATENT DOCUMENTS

2015/0279711 A1\* 10/2015 Matsutori ......... H01L 21/67376
206/723
2015/0294882 A1\* 10/2015 Matsutori ......... H01L 21/67376
206/723

FOREIGN PATENT DOCUMENTS

| JP | 2003174081 | 6/2003 |
| JP | 2008270281 | 11/2008 |
| JP | 2011181867 | 9/2011 |
| WO | WO 9939994 | 8/1999 |

\* cited by examiner

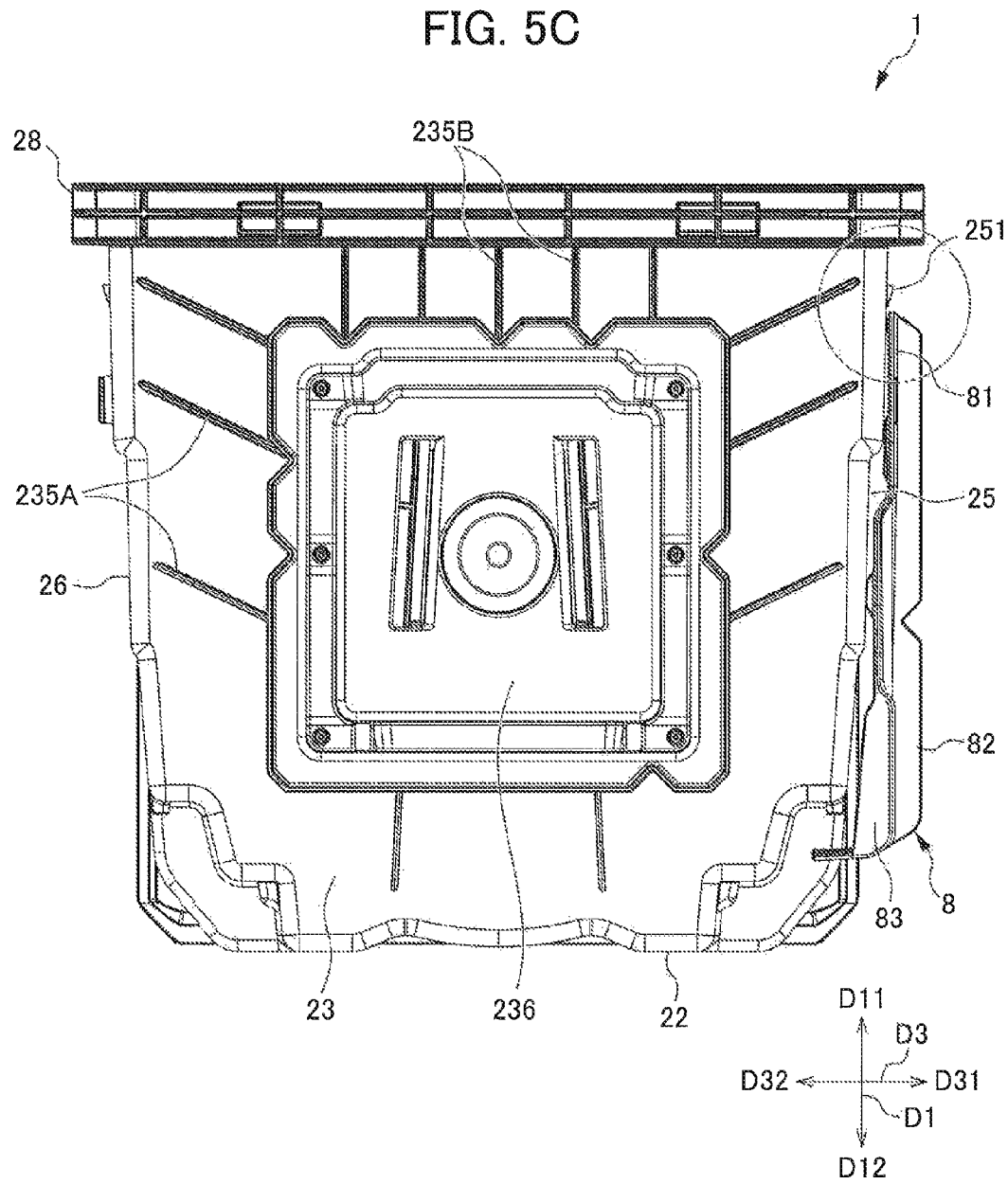

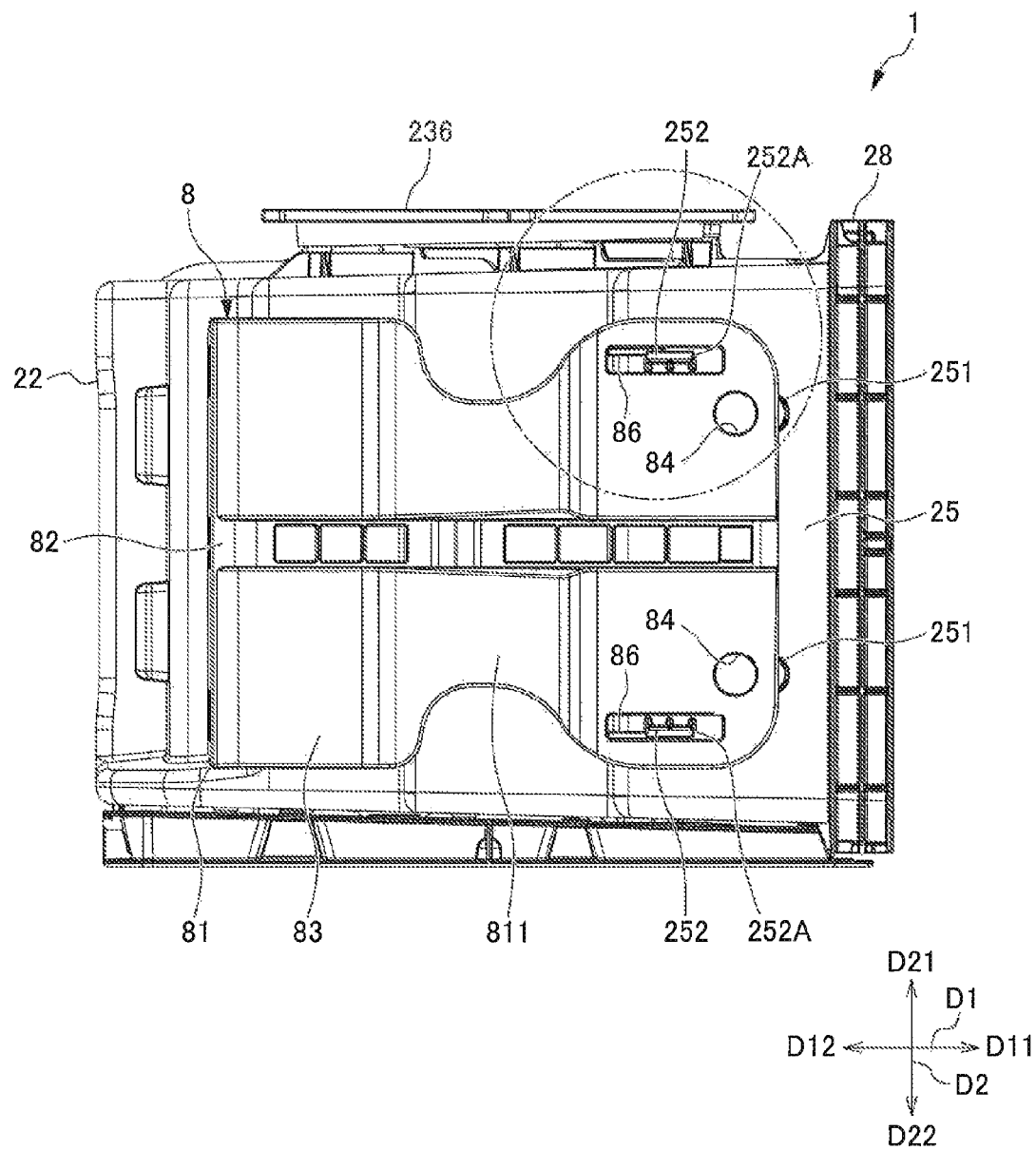

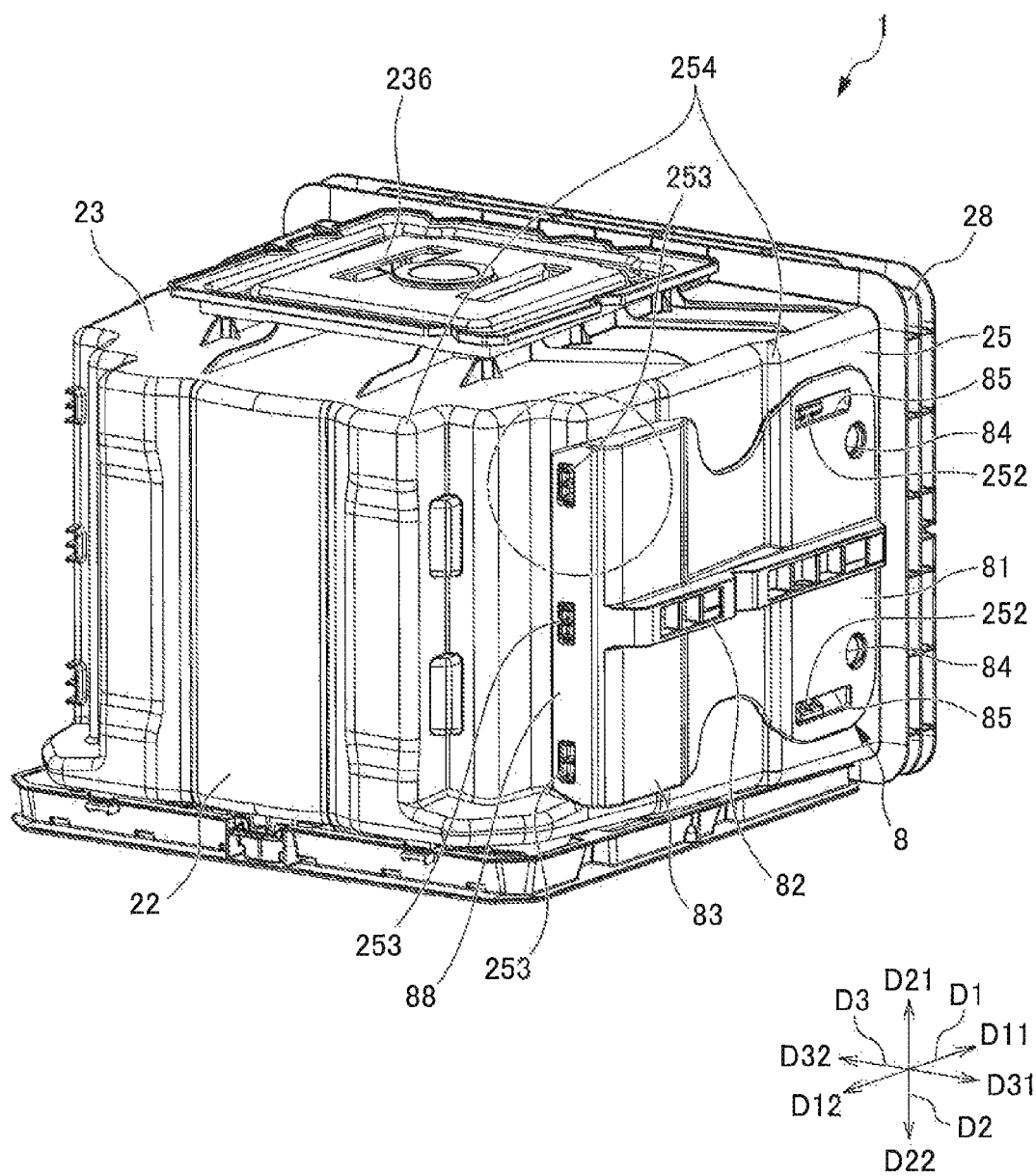

SUBSTRATE STORAGE CONTAINER WITH HANDLING MEMBERS

TECHNICAL FIELD

The present invention relates to a substrate storage container that stores a substrate such as a semiconductor wafer, etc.

BACKGROUND ART

As a container that stores a substrate such as semiconductor wafer, a substrate storing container has been known conventionally that includes a container main body, lid body, and a handling member. The container main body has a tubular wall portion with a container main body opening portion formed at one end and the other end closed. A substrate storing space is formed in the container main body. The substrate storing space is formed to be surrounded by the wall portion and can store a plurality of substrates. The lid body can be removably attached to the container main body opening portion and can close the container main body opening portion. Lateral substrate support portions provided at the wall portions so as to form a pair in the substrate storing space. When the container main body opening portion is not closed by the lid body, the lateral substrate support portion can support edge portions of a plurality of substrates in a state in which adjacent substrates are arranged in parallel to be spaced apart by a predetermined interval.

A lid body side substrate support portion (front retainer) is a part of the lid body and provided at a portion which faces the substrate storing space when the container main body opening portion is closed. When the container main body opening portion is closed by the lid body, the lid body side substrate support portion can support edge portions of a plurality of substrates.

The wall portion substrate support portions are provided at the wall portions so as to form a pair with the lid body side substrate support portion. The wall portion substrate support portion can support edge portions of a plurality of substrates. When the container main body opening portion is closed by the lid body, the wall portion substrate support portion retains the plurality of substrates in a state in which adjacent substrates are arranged in parallel to be spaced apart by a predetermined interval by supporting the plurality of substrates in cooperation with the lid body side substrate support portion.

A handling member is removably attached to a side wall which constitutes a part of the wall portion. An end of the handling member has a locking hook and the handling member is fixed at the container main body by the locking hook being locked at the side wall (refer to Pamphlet of PCT International Publication No. WO99/039994).

Patent Document 1: Pamphlet of PCT International Publication No. WO99/039994

DISCLOSURE OF THE INVENTION

Problems to be Solved by the Invention

However, in a conventional substrate storing container, the locking hook of the handling member may be broken. Furthermore, locking of the locking hook of the handling member at a side wall is not secure, and thus insufficient.

It is an object of the present invention to be able to lock a handling member securely at a side wall and provide a substrate storing container which hardly receives damage to the configuration for locking the handling member at the side wall.

Means for Solving the Problems

The present invention relates to a substrate storing container including: a container main body including a tubular wall portion with a container main body opening portion formed at one end and the other end closed, the wall portion having a back wall, an upper wall, a lower wall, and a pair of side walls, the container main body opening portion being formed by one end of the upper wall, one end of the lower wall, and one end of the side walls, in which a substrate storing space that can store a plurality of substrates and is in communication with the container main body opening portion is formed by an inner face of the upper wall, an inner face of the lower wall, inner faces of the side walls, and an inner face of the back wall; a lid body that is removably attached to the container main body opening portion and can close the container main body opening portion; and a pair of the handling members that is arranged to face outer faces of the pair of the side walls, respectively, and can move between a mounting position and a detachment position along the side wall, in which a pair of the handling members is fixed to be mounted to the side walls by moving to the mounting position and is detached from the side walls by moving to the detachment position, in which the side wall includes: a semicircular convex portion in semicircular shape that is configured so that a projection amount becomes greater gradually as the semicircular convex portion projects from the side wall in a direction distancing from the outer face of the side wall, and approaches the mounting position from the detachment position; a guide member that movably guides the handling member between the mounting position and the detachment position; and a back side engaging portion that is formed at a back side of a pair of the side walls, in which a portion at which a projection amount of the semicircular convex portion is a minimum is located at a position which is the closest to the detachment position of the semicircular convex portion, and a portion at which a projection amount of the semicircular convex portion is a maximum is located at a position which is the closest to the mounting position of the semicircular convex portion, in which the handling member includes: a substantially plate-like handling Member main body that is arranged along a pair of the side walls, respectively; a circular position-restriction through hole that is formed to extend through the handling member main body in a thickness direction of the handling member and with which the semicircular convex portion can be engaged; a handling member side guided portion that is engaged with the guide member and of which a movement is guided between the mounting position and the detachment position by the guide member; and a back side guided portion that can be engaged with the back side engaging portion by a movement of the handling member from the detachment position to the mounting position, and in which engagement of the handling member side guided portion with the guide member and engagement of the back side guided portion with the back side engaging portion allows the handling member to be fixed in a manner of being not movable in an upper/lower direction with respect to the side wall, and engagement of the semicircular convex portion with the position-restriction through hole allows the handling member to be fixed in a manner of being not movable in a movement direction that connects the mounting position with the detachment position with respect to the side wall.

Furthermore, it is preferable that the substrate is stored in the substrate storing space in a positional relationship in which an upper face and a lower face of the substrate become substantially horizontal; a back side portion of the pair of the side walls has a back portion outer face depression portion at which outer faces of the pair of the side walls are depressed along circumferential edges of the substrates stored in the substrate storing space, respectively; and a pair of the handling members respectively includes a weight portion that can be fit to the back portion outer face depression portion at a portion of the handling member main body when a pair of the handling members is located at the mounting position and facing the back portion outer face depression portion.

Furthermore, it is preferable that the weight portion is configured such that the handling member main body becomes thicker toward a side at which the pair of the handling member faces an outer face of the side wall.

Furthermore, it is preferable that the guide member has a pair of guide grooves that is formed at the side wall and open to an upper direction and a lower direction, respectively, to extend in the moving direction; and the handling member side guided portion is configured by a pair of groove engagement portions that can be engaged with the guide groove and extends in the moving direction.

Furthermore, it is preferable that the substrate is stored in the substrate storing space in a positional relationship which an upper face and a lower face of the substrate become substantially horizontal; a back side portion of a pair of the side walls has a back portion outer face depression portion at which outer faces of the pair of the side walls are depressed in a stepwise manner along circumferential edges of the substrates stored in the substrate storing space, respectively; and the back side engaging portion is configured by a projecting portion that projects from an outer face of the back portion outer face depression portion in a detachment side direction from the mounting position to the detachment position, an end of the handling member main body in the detachment side direction is orthogonal to the detachment side direction and has an end plate-like portion that extends in a direction approaching the side wall, and the back side guided portion is configured by a plate-like portion through hole that is formed at the end plate-like portion, formed to extend through the end plate-like portion, and with which the projecting portion can be engaged.

Furthermore, it is preferable that the handling member includes a rib that extends in parallel in the moving direction at a center portion of the handling member main body in a direction orthogonal to the moving direction, and a substrate storing container is lifted by a fork lift by the rib being supported by a fork of the fork lift.

Effects of the Invention

In accordance with the present invention, it is possible to lock a handling member securely at a side wall and provide a substrate storing container which hardly receives damage to a configuration for locking the handling member at the side wall.

BRIEF DESCRIPTION OF THE DRAWINGS

FIG. 5C is a plan view illustrating a state in which the handling member 8 of the substrate storing container 1 according to the first embodiment of the present invention is located at a detachment position;

FIG. 6A is a lateral view illustrating a state of the handling member 8 of the substrate storing container 1 according to the first embodiment of the present invention moving from the detachment position to a mounting position;

FIG. 7C is a perspective view from behind illustrating a state in which the handling member 8 of the substrate storing container 1 according to the first embodiment of the present invention is located at the mounting position;

PREFERRED MODE FOR CARRYING OUT THE INVENTION

Figure 1:
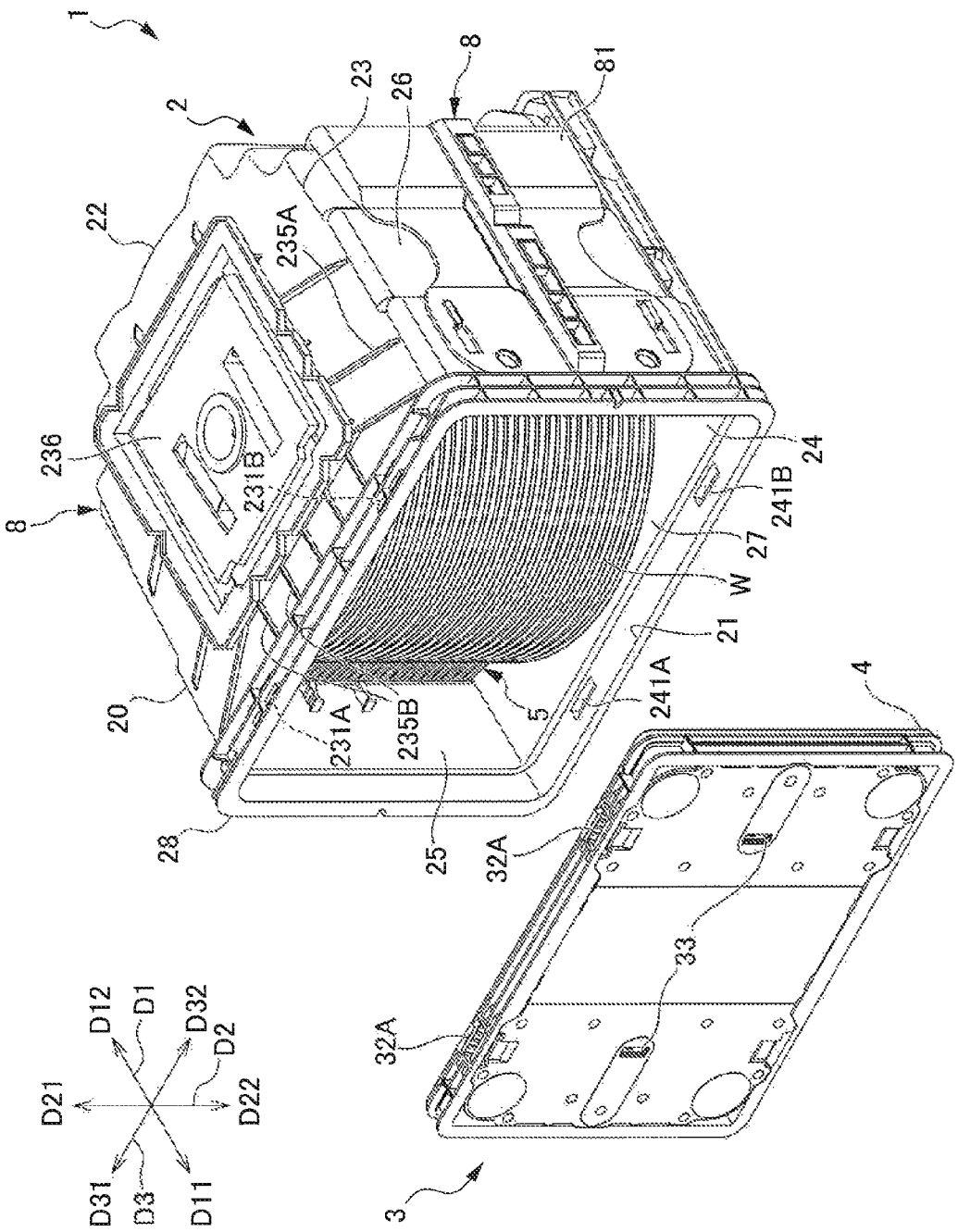
FIG. 1 is an exploded perspective illustrating a substrate storing container 1 according to the first embodiment of the present invention.
Figure 2A:
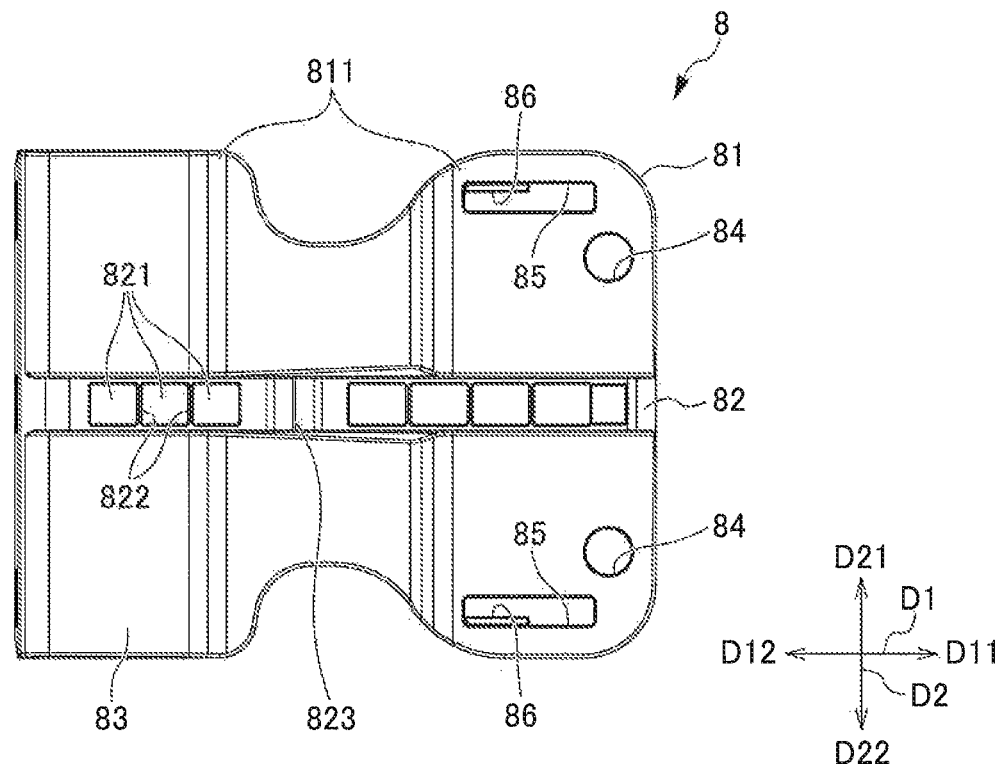
FIG. 2A is a lateral view illustrating a handling member 8 of the substrate storing container 1 according to the first embodiment of the present invention.
Figure 2B:
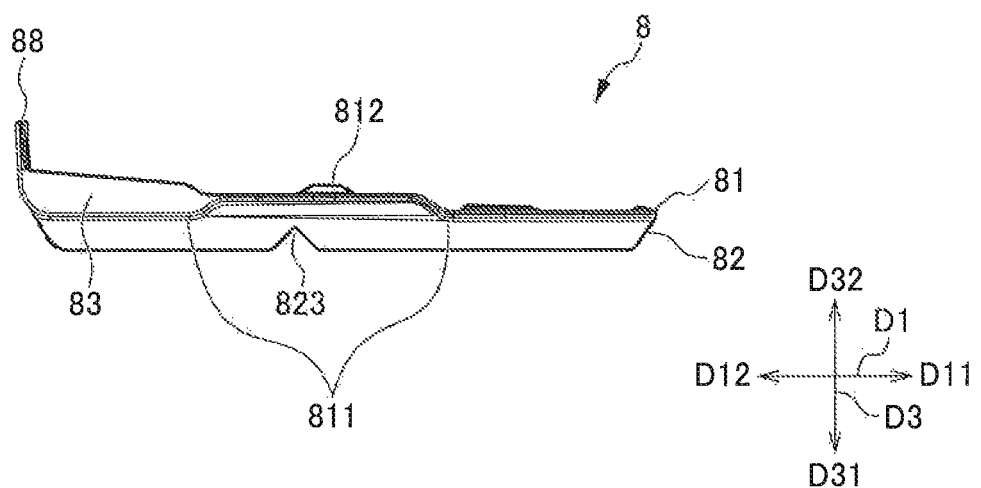
FIG. 2B is a plan view illustrating the handling member 8 of the substrate storing container 1 according to the first embodiment of the present invention.
Figure 2C:
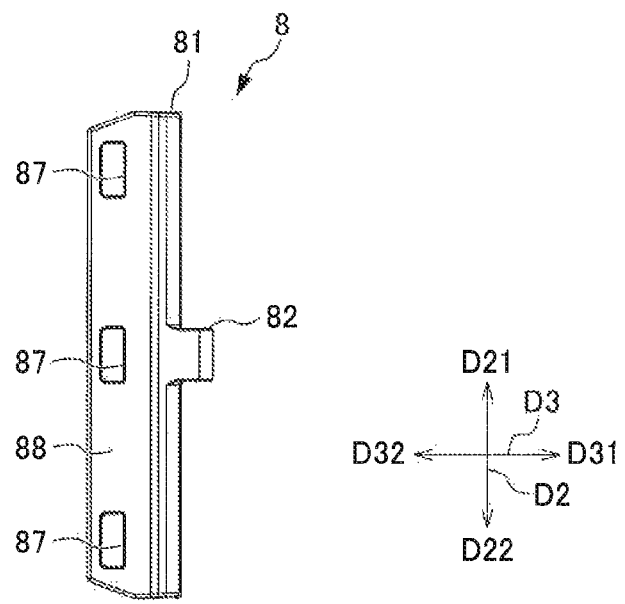
FIG. 2C is a rear view illustrating the handling member 8 of the substrate storing container 1 according to the first embodiment of the present invention.
Figure 3:
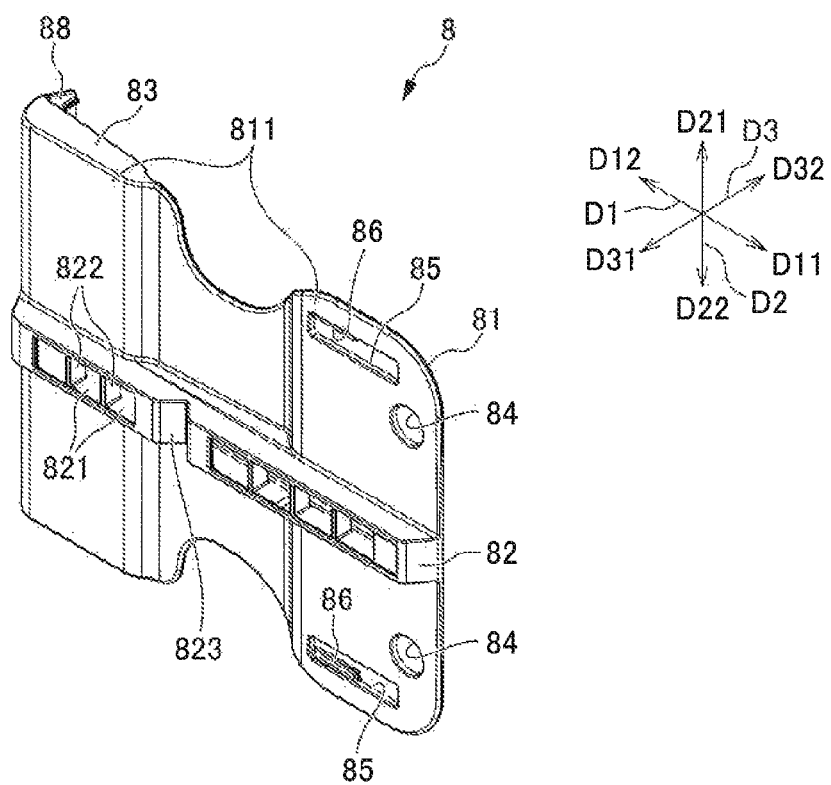
FIG. 3 is a perspective view illustrating the handling member 8 of the substrate storing container 1 according to the first embodiment of the present invention.

In the following, a substrate storing container 1 according to the first embodiment of the present invention will be described with reference to the drawings. FIG. 1 is an exploded perspective illustrating a substrate storing container 1 according to the first embodiment of the present invention. FIG. 2A is a lateral view illustrating a handling member 8 of the substrate storing container 1 according to the first embodiment of the present invention. FIG. 2B is a plan view illustrating the handling member 8 of the substrate storing container 1 according to the first embodiment of the present invention. FIG. 2C is a rear view illustrating the handling member 8 of the substrate storing container 1 according to the first embodiment of the present invention. FIG. 3 is a perspective view illustrating the handling member 8 of the substrate storing container 1 according to the first embodiment of the present invention.

Figure 4A:
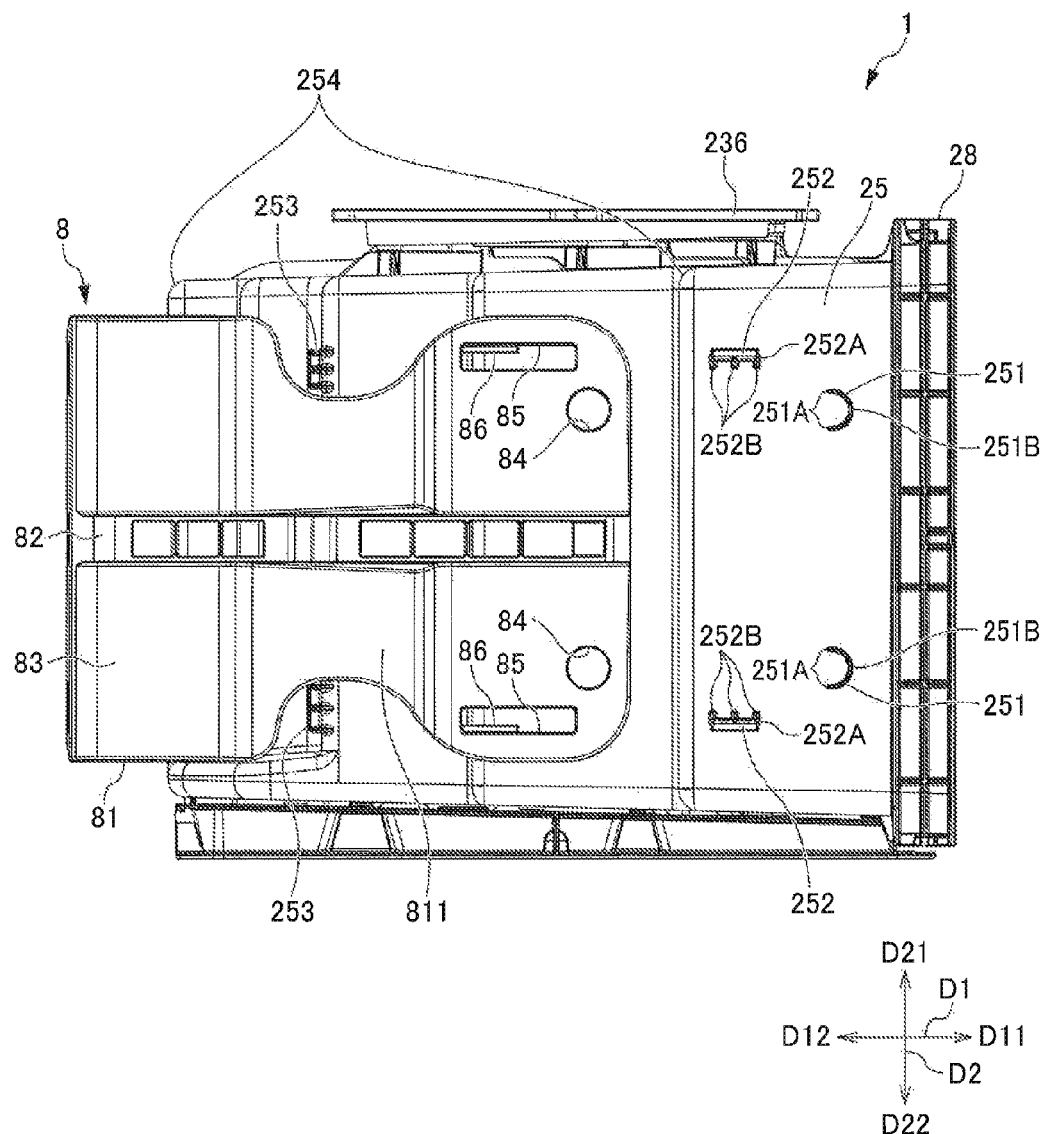
FIG. 4A is a lateral view illustrating a state mounting the handling member 8 to a container main body of the substrate storing container 1 according to the first embodiment of the present invention.
Figure 4B:
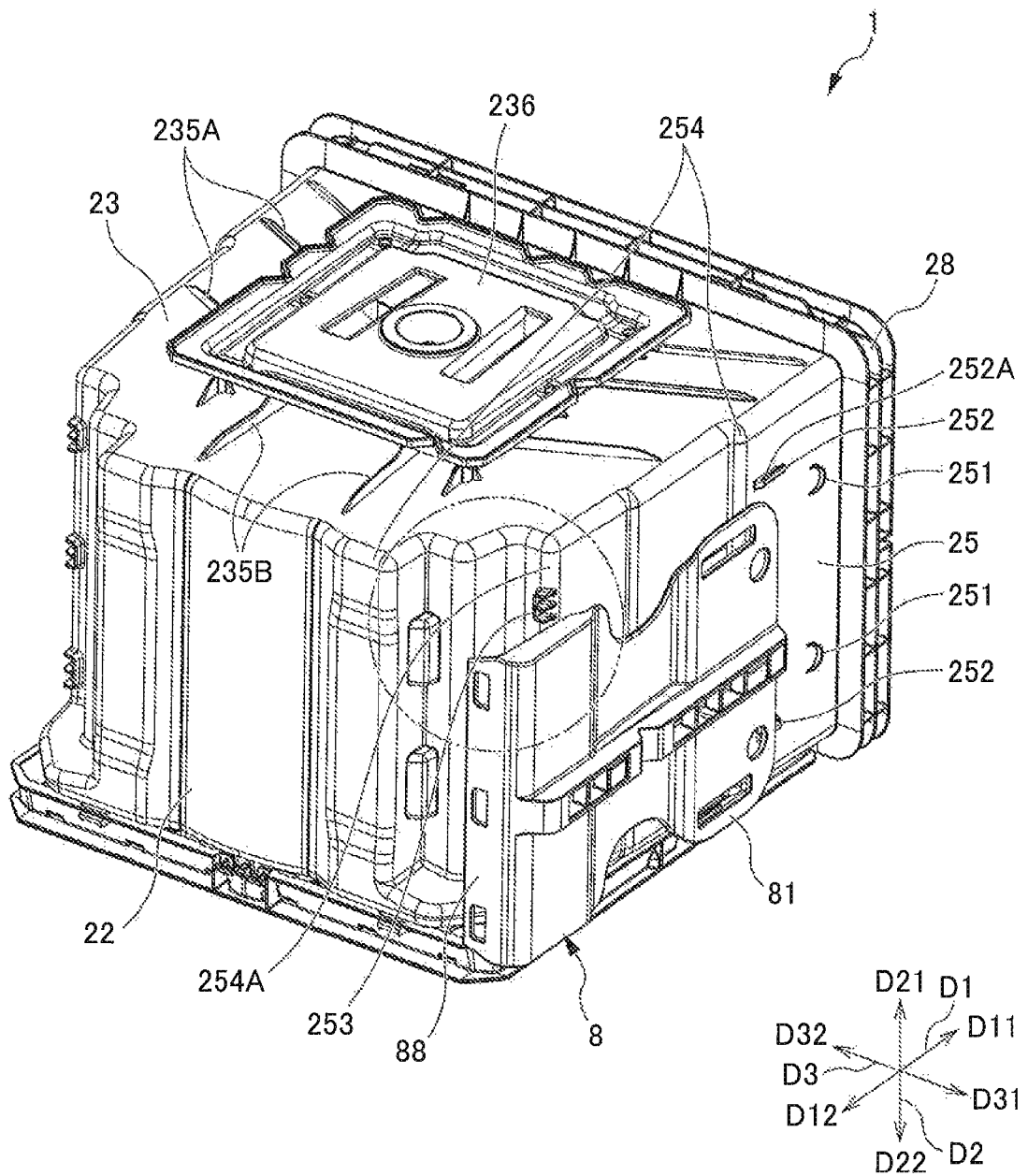
FIG. 4B is a perspective view from behind illustrating a state mounting the handling member 8 to a container main body of the substrate storing container 1 according to the first embodiment of the present invention.
Figure 4C:
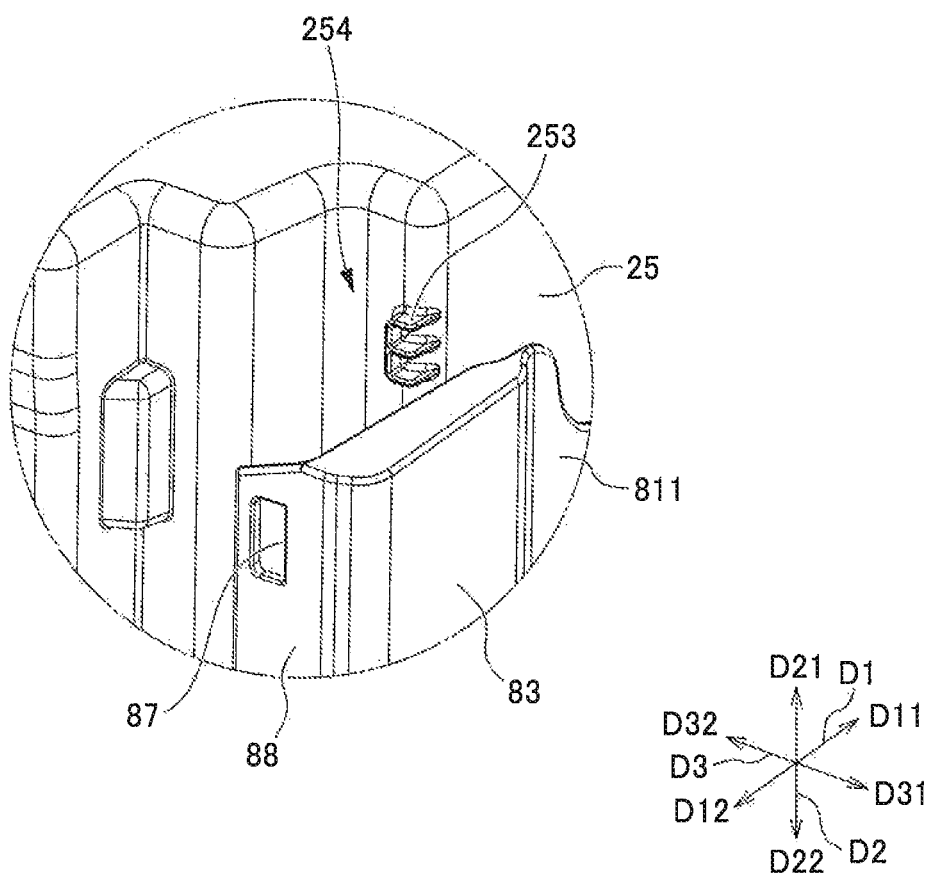
FIG. 4C is an enlarged perspective view from behind illustrating a state mounting the handling member 8 to a container main body of the substrate storing container 1 according to the first embodiment of the present invention.
Figure 5A:
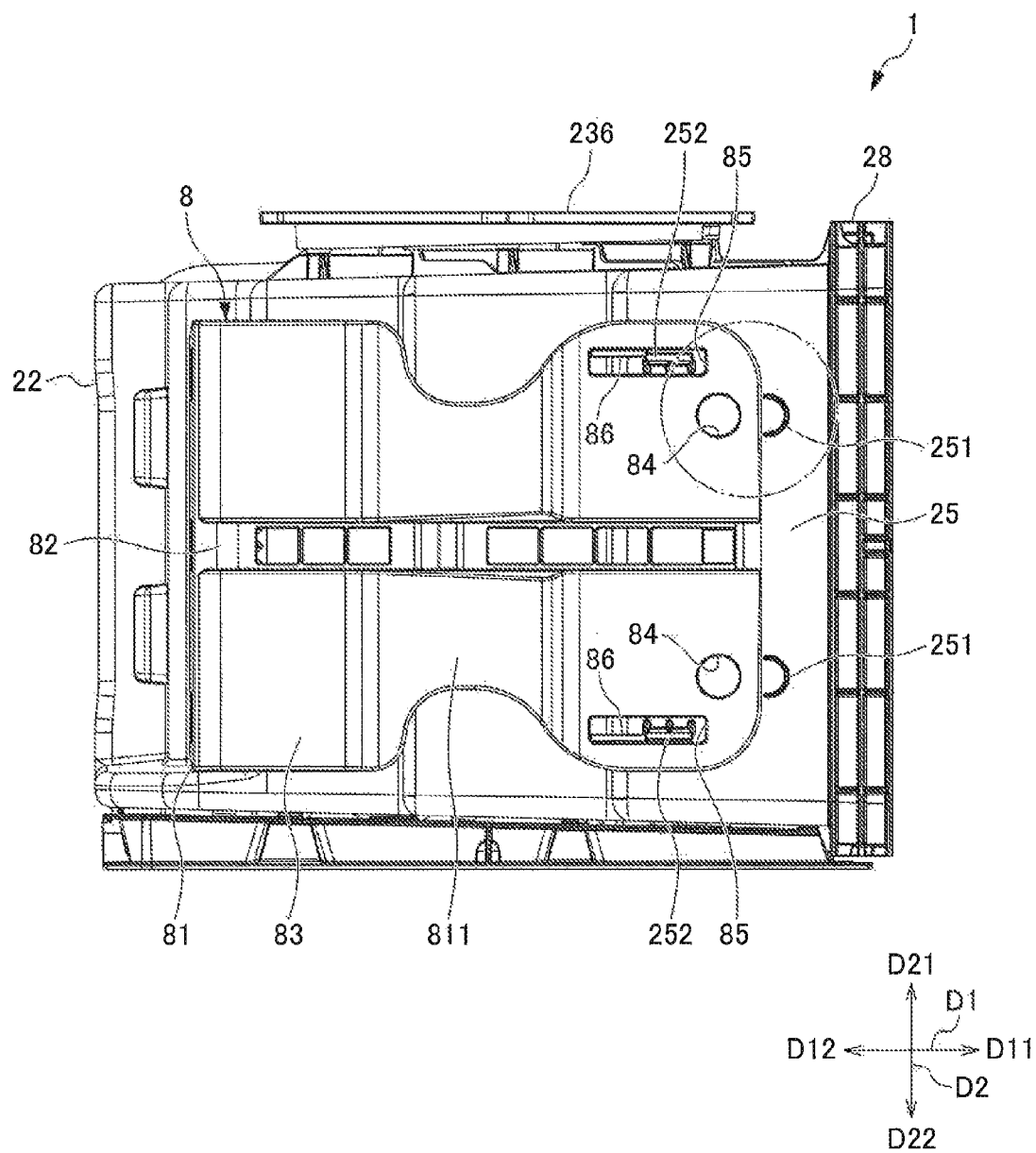
FIG. 5A is a lateral view illustrating a state in which the handling member 8 of the substrate storing container 1 according to the first embodiment of the present invention is located at a detachment position.
Figure 5B:
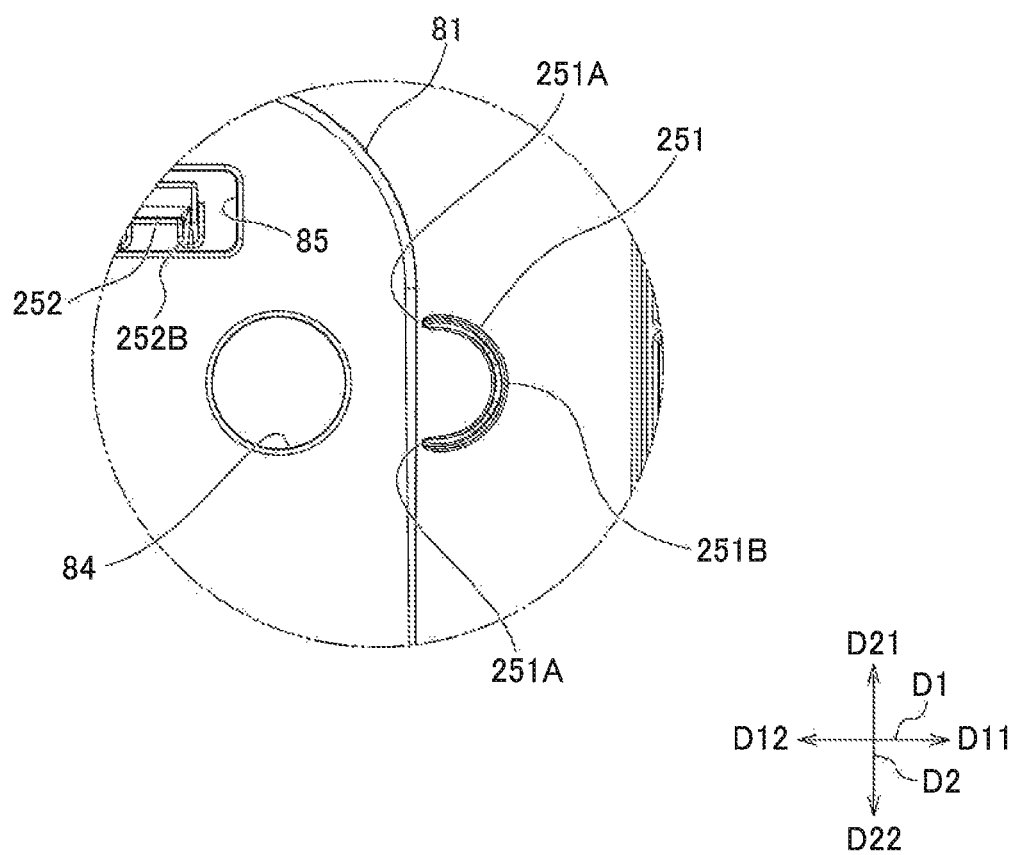
FIG. 5B is an enlarged lateral view illustrating a state in which the handling member 8 of the substrate storing container 1 according to the first embodiment of the present invention is located at a detachment position.
Figure 5D:
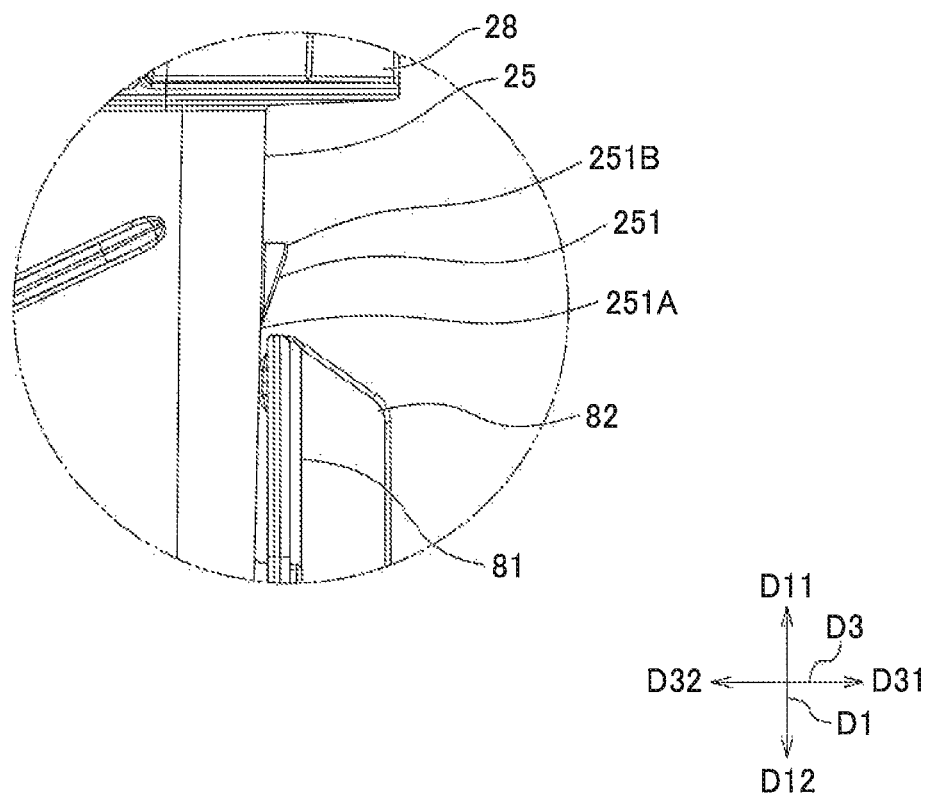
FIG. 5D is an enlarged plan view illustrating a state in which the handling member 8 of the substrate storing container 1 according to the first embodiment of the present invention is located at a detachment position.
Figure 6B:
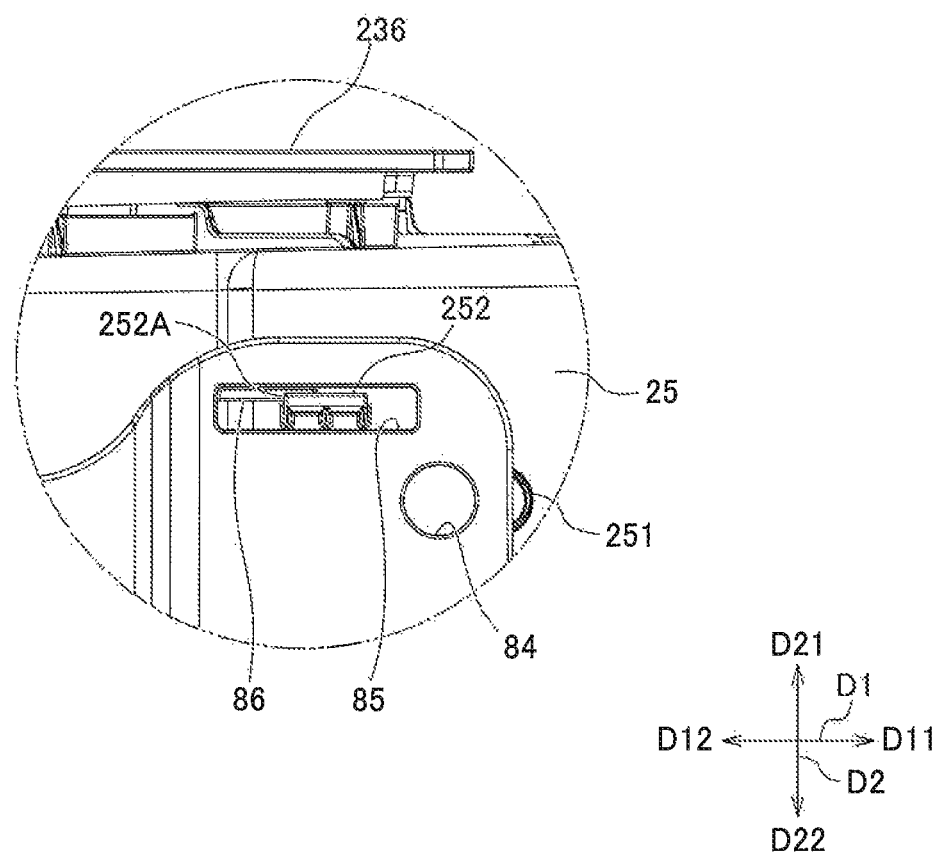
FIG. 6B is an enlarged lateral view illustrating a state of the handling member 8 of the substrate storing container 1 according to the first embodiment of the present invention moving from the detachment position to a mounting position.
Figure 7A:
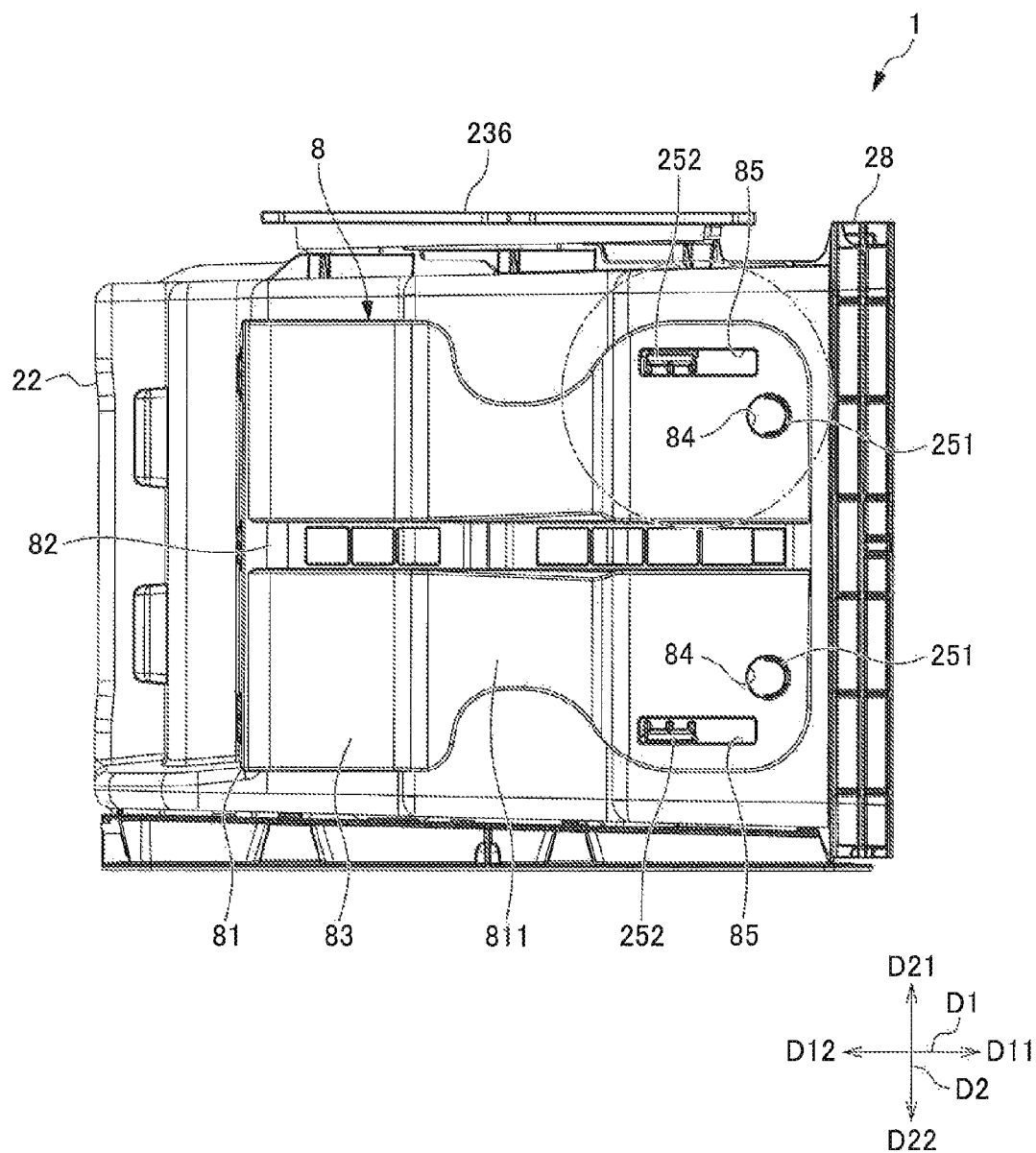
FIG. 7A is a lateral view illustrating a state in which the handling member 8 of the substrate storing container 1 according to the first embodiment of the present invention is located at the mounting position.
Figure 7B:
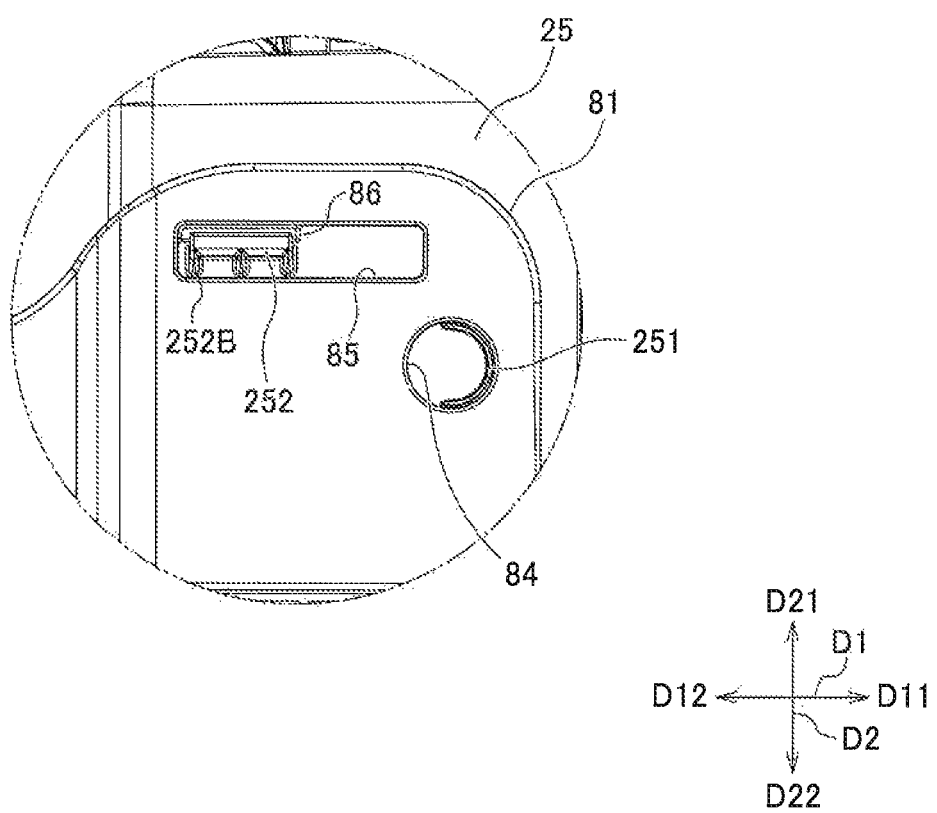
FIG. 7B is an enlarged lateral view illustrating a state in which the handling member 8 of the substrate storing container 1 according to the first embodiment of the present invention is located at the mounting position.
Figure 7D:
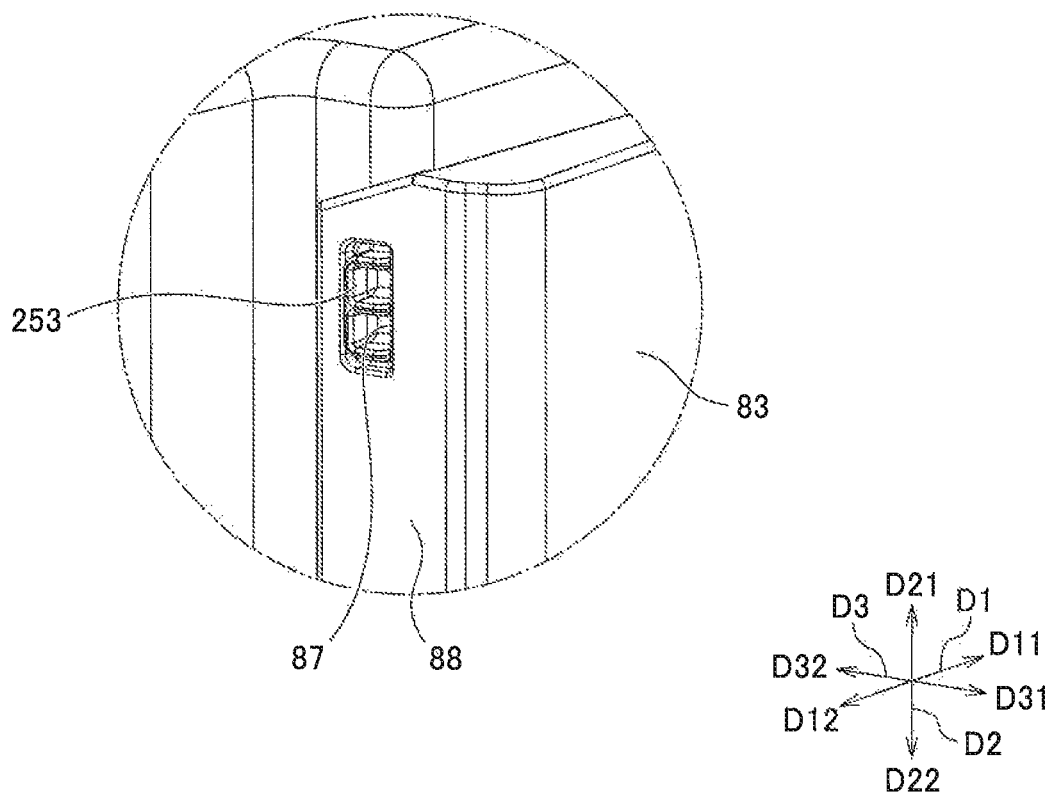
FIG. 7D is an enlarged perspective view from behind illustrating a state in which the handling member 8 of the substrate storing container 1 according to the first embodiment of the present invention is located at the mounting position.

FIG. 4A is a lateral view illustrating a state mounting the handling member 8 to a container main body of the substrate storing container 1 according to the first embodiment of the present invention; FIG. 4B is a perspective view from behind illustrating a state mounting the handling member 8 to a container main body of the substrate storing container 1 according to the first embodiment of the present invention; FIG. 4C is an enlarged perspective view from behind illustrating a state mounting the handling member 8 to a container main body of the substrate storing container 1 according to the first embodiment of the present invention; FIG. 5A is a lateral view illustrating a state in which the handling member 8 of the substrate storing container 1 according to the first embodiment of the present invention is located at a detachment position; FIG. 5B is an enlarged lateral view illustrating a state in which the handling member 8 of the substrate storing container 1 according to the first embodiment of the present invention is located at a detachment position; FIG. 5C is a plan view illustrating a state in which the handling member 8 of the substrate storing container 1 according to the first embodiment of the present invention is located at a detachment position; FIG. 5D is an enlarged plan view illustrating a state in which the handling member 8 of the substrate storing container 1 according to the first embodiment of the present invention is located at a detachment position;

FIG. 6A is a lateral view illustrating a state of the handling member 8 of the substrate storing container 1 according to the first embodiment of the present invention moving from the detachment position to a mounting position; FIG. 6B is an enlarged lateral view illustrating a state of the handling member 8 of the substrate storing container 1 according to the first embodiment of the present invention moving from the detachment position to a mounting position; FIG. 7A is a lateral view illustrating a state in which the handling member 8 of the substrate storing container according to the first embodiment of the present invention is located at the mounting position; FIG. 7B is an enlarged lateral view illustrating a state in which the handling member 8 of the substrate storing container 1 according to the first embodiment of the present invention is located at the mounting position; FIG. 7C is a perspective view from behind illustrating a state in which the handling member 8 of the substrate storing container 1 according to the first embodiment of the present invention is located at the mounting position; FIG. 7D is an enlarged perspective view from behind illustrating a state in which the handling member 8 of the substrate storing container 1 according to the first embodiment of the present invention is located at the mounting position;

Herein, for the purpose of illustration, the direction from a container main body 2 toward a lid body 3 (described later) (direction toward the lower left in FIG. 1) is defined as a forward direction D11 and the direction opposite to the direction D11 is defined as a backward direction D12. Furthermore, these directions are defined as a forward/backward direction D1. In addition, the direction from a lower wall 24 to an upper wall 23 (described later) (upper direction in FIG. 1) is defined as an upper direction D21 and the direction opposite to the direction D21 is defined as a lower direction D22. Furthermore, these directions are defined as an upper/lower direction D2. Moreover, the direction from a second side wall 26 to a first side wall 25 (described later) (direction to the upper left in FIG. 1) is defined as a left direction D31 and the direction opposite to the direction D31 is defined as a right direction D32. Furthermore, these directions are defined as a left/right direction D3.

Furthermore, a substrate W (refer to FIG. 1, etc.) stored in a substrate storing container 1 is a disk-like silicon wafer, glass wafer, sapphire wafer, etc., and is a thin member used for industrial use. The substrate W in the present embodiment is a silicon wafer having a diameter of 450 mm.

As illustrated in FIG. 1, the substrate storing container 1 includes a container main body 2, a lid body 3, and a handling member 8.

The container main body 2 has a tubular wall portion 20 with a container main body opening portion 21 formed at one end and the other end closed. A substrate storing space is formed in the container main body 2. The substrate storing space 27 is formed to be surrounded by the wall portion 20. A substrate support plate-like portion 5 is disposed at a part of the wall portion 20 that is a portion forming the substrate storing space 27. A plurality of substrates W can be stored in the substrate storing space 27.

The substrate support plate-like portion 5 is provided at the wall portion 20 so as to form a pair in the substrate storing space 27 in the left/right direction D3. When the container main body opening portion 21 is not closed by the lid body 3, the substrate support plate-like portion 5 can support the edge portions of the plurality of substrates W in a state in which adjacent substrates W are arranged in parallel to be spaced apart by a predetermined interval. A back side substrate support portion (not illustrated) is provided at a back side of the substrate support plate-like portion 5. When the container main body opening portion 21 is closed by the lid body 3, the back side substrate support portion (not illustrated) can support rear portions of the edge portions of the plurality of substrates W.

The lid body 3 can be removably attached to the container main body opening portion 21 and can close the container main body opening portion 21. The front retainer (not illustrated) is a part of the lid body 3 and provided at a portion (the other side face of the lid body 3 illustrated in FIG. 1) which faces the substrate storing space 27 when the container main body opening portion 21 is closed by the lid body 3. The front retainer (not illustrated) is provided so as to form a pair with the back side substrate support portion (not illustrated).

When the container main body opening portion 21 is closed by the lid body 3, the front retainer (not illustrated) can support front portions of the edge portions of the plurality of substrates W. When the container main body opening portion 21 is closed by the lid body 3, the front retainer (not illustrated) retains the plurality of substrates W in a state in which adjacent substrates W are arranged in parallel to be spaced apart by a predetermined interval by supporting the plurality of substrates W in cooperation with the back side substrate support portion (not illustrated).

A pair of handling members 8 is arranged to face an outer face of a pair of the side walls, respectively, so as to follow an outer face of a pair of side walls 25 and 26 (described later). The handling member 8 can move along the side walls 25 and 26 between a mounting position (refer to FIG. 7A, etc.), which is a front side position, and a detachment position (refer to FIG. 5A, etc.), which is a rear side position. The handling member 8 is fixed and mounted at the side walls 25 and 25 by moving to the mounting position, and detached from the side walls 25 and 26 by moving to the detachment position. Each portion will be described in detail in the following.

As illustrated in FIG. 1, the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 are made of a plastic material, etc., and are configured so as to be integrally molded with polycarbonate in the first embodiment.

The first side wall 25 faces the second side wall 26 and the upper wall 23 faces the lower wall 24. A rear edge of the upper wall 23, a rear edge of the lower wall 24, a rear edge of the first side wall 25, and a rear edge of the second side wall 26 are all connected to the back wall 22. A front edge of the upper wall 23, a front edge of the lower wall 24, a front edge of the first side wall 25, and a front edge of the second side wall 26 have a positional relationship opposite the back wall 22, and configure an opening circumferential portion 28 which forms the container main body opening 21 in a substantially rectangular shape.

The opening circumferential portion 28 is provided at one edge portion of the container main body 2, and the back wall 22 is located at the other edge portion of the container main body 2. The profile of the container main body 2 formed by the outer faces of the wall portion 20 is a box shape. Inner faces of the wall portion 20, i.e. an inner face of the back wall 22, an inner face of the upper wall 23, an inner face of the lower wall 24, an inner face of the first side wall 25, and an inner face of the second side wall 26, form the substrate storing space 27, which is surrounded thereby. The container main body opening portion 21 formed by the opening circumferential portion 28 is surrounded by the wall portion 20 and is in communication with the substrate storing space 27 formed inside the container main body 2. The substrate storing space 27 can store a maximum of 25 substrates w in a positional relationship in which upper faces and lower faces of the substrates W are substantially horizontal.

As illustrated in FIG. 1, latch engagement concave portions 231A, 2313, 241A, and 241E, which are concave outwardly from the substrate storing space 27, are portions of the upper wall 23 and the lower wall 24 and are formed proximal to the opening circumferential portion 28. Each of the latch engagement concave portions 231A, 231B, 241A, and 241B is respectively formed in the vicinities of both right and left edge portions of the upper wall 23 and the lower wall 24. The total amount thereof is four.

As illustrated in FIG. 1, a flange fixing portion (not illustrated) and ribs 235A and 235B are provided so as to be integrally formed with the upper wall 23 at an outer face of the upper wall 23. The flange fixing portion (not illustrated) is arranged at a center location of the upper wall 23. As illustrated in FIG. 1, a top flange 236 as a locked portion is fixed at the flange fixing portion. The top flange 236 is arranged at the center location of the upper wall 23. When suspending the substrate storing container 1 by an AMHS (Automated Material Handling System), PGV (Person Guided Vehicle), etc., the top flange 236 is hung from an arm of the machine (not illustrated) so that the substrate storing container 1 is suspended by the arm.

The rib 235A and 235B are provided at the upper wall. Three ribs 235A extend in a left-forward direction and a right-forward direction, respectively, from the top flange 236. Furthermore, five ribs 25B extend in the forward direction D11 from the top flange 236 and two ribs 235B extend in the backward direction D12 from the top flange 236.

Since the side wall 25 has a symmetrical shape with respect to the side wall 26, only the side wall 25 will be described below and the explanations for the side wall 26 are omitted. As illustrated in FIG. 4A, etc., the side wall 25 includes a semicircular convex portion 251 in a semicircular shape, a guide rib 252 as a guide member, and a side wall rear portion projection 253 as a projecting portion of a back side engaging portion. Furthermore, the side wall 25 includes a back portion outer face depression portion 254 (refer to FIG. 4B, etc.).

As illustrated in FIG. 4B, the back portion outer face depression portion 254 is formed at the side wall 25. More specifically, the back portion outer face depression portion 254 is formed in a stepwise manner so that the distance between the side wall 25 and the side wall 26 in the left/right direction D3 becomes shorter gradually toward the backward direction D12 from the opening circumferential portion 28. More specifically, regarding the portion of the back portion outer face depression portion 254 at the back side of (rear side) of the side wall 25, an outer face of a pair of the side wall 25 is depressed in a stepwise manner along a periphery of the substrate W in the disc shape stored in the substrate storing space 27 (refer to FIG. 1), and the step difference in the left/right direction D3 is configured so as to be larger at the portion of the back portion outer face depression portion 254 at the back side (rear side) of the side wall 25 than the portion of the back portion outer face depression portion 254 at the front side of the side wall 25.

As illustrated in FIG. 4A, the semicircular convex portion 251 is a front portion of the side wall 25 and is located in the vicinity of the opening circumferential portion 28. A pair of the semicircular convex portions 251 exists at the side wall 25. The semicircular convex portions 251 exist at a location approximately one fourth the height below the side wall 25 in the upper/lower direction from the upper end of the side wall 25 and at a location approximately one fourth the height above the side wall 25 in the upper/lower direction from the lower end of the side wall 25.

Regarding the semicircular convex portion 251, a diameter portion of the semicircle is located in the most backward direction D12, and the diameter has a positional relationship that coincides with the upper/lower direction D2. The semicircular convex portion 251 projects from the outer face of the side wall 25 in a direction spaced apart, i.e. from the side wall 25 in the left direction D31. The semicircular convex portion 251 is configured so that a projection amount becomes greater gradually as it approaches the mounting position from the detachment position toward the forward direction D11. Therefore, at the semicircular convex portion 251, a portion 251A at which the projection amount of the semicircular convex portion 251 is the minimum is the diameter portion of the semicircle. This portion is located at the closest position to the detachment position at the semicircular convex portion 251. At the semicircular convex portion 251, a portion 251B at which the projection amount of the semicircular convex portion 251 is the maximum is a part a semicircular arc and an intermediate portion between both the edges located at the diameter of the semicircle. This portion is located at a position closest to the mounting position at the semicircular convex portion 251.

A pair of the guide ribs 252 exists in the upper/lower direction D2 of the side wall 25 and at a location approximately one fourth the depth in the backward direction D12 of the side wall 25 from the front end of the side wall 25 in the forward/backward direction. The guide ribs 252 exist at a location approximately one eighth below the height of the side wall 25 in the upper/lower direction from the upper end of the side wall 25 and at a location approximately one eighth the height above the side wall 25 in the upper lower direction from the lower end of the side wall 25.

As illustrated in FIGS. 4A and 4E, the upper side guide rib 252 is configured so as to be formed integrally with the side wall 25 and extends in the forward/backward direction D1. The guide ribs 252 have a cross section in a substantially shape which is made by being cut parallel to the upper/lower direction D2 and the left/right direction D3, and a guide groove 252A which is open in the upper direction D21 is formed by the outer face of the guide rib 252 and the outer face of the side wall 25. A front end and a rear end of the guide groove 252A are open in the forward direction D11 and the backward direction D12, respectively.

Similarly, the guide rib 252 at the lower side has a cross section in a substantially L-shape which is made by being cut parallel to the upper/lower direction D2 and the left/right direction D3, and a guide groove 252A which is open below is formed by the outer face of the guide rib 252 and the outer face of the side wall 25. The front end and the rear end of the guide groove 252A are open in the forward direction D11 and the backward direction D12, respectively.

Therefore, a pair of the guide ribs 252 and 252 as guide members includes a pair of the guide grooves 252A and 252A that are formed at the side wall 25, open in the upper direction D21 and the lower direction D22, respectively, and extends in a direction connecting the mounting position and the detachment position (hereinafter, referred to as "moving direction"). The guide ribs 252 movably guide the handling member 8 between the mounting position (refer to FIG. 7A, etc.) and the detachment position (refer to FIG. 5A, etc.). Furthermore, as illustrated in FIG. 4A, three support ribs 252B connecting the lower end of the guide ribs 252 with the side wall 25 are provided at the front end, the rear end, and the center portion of the upper side guide rib 252, respectively. Similarly, three support ribs 252E connecting the upper end of the guide ribs 252 with the side wall 25 are provided at the front end, the rear end, and the center portion of the lower side guide rib 252, respectively.

As illustrated in FIGS. 4A and 7C, three side wall rear portion projections 253 exist at a location approximately one fifth the depth in the forward/backward direction of the side wall 25 from the rear end of the side wall 25 in the forward direction D11, in a manner at regular intervals in the upper/lower direction D2. The side wall rear portion projections 253 exist at a location approximately one eighth below the height of the side wall 25 in the upper/lower direction D2 from the upper end of the side wall 25 in the upper/lower direction 132, at a location approximately one eighth the height above the side wall 25 in the upper/lower direction D2 from the lower end of the side wall 25, and at an intermediate location of these locations, respectively.

The side wall rear portion projections 253 exist in a stepwise manner at the third rear end face 254A from the front end of the back portion outer face depression portion 254, which is a portion of the back portion outer face depression portion 254 at the back side (rear side) of the side wall 25. The rear end face 254A constitutes an outer face of the back portion outer face depression portion 254. The side wall rear portion projections 253 are configured to be formed integrally with the side wall 25 and projects in a direction from the third rear end face 254A of the back portion outer face depression portion 254 in a stepwise manner in the backward direction D12, i.e. a direction from the mounting position of the handling member 8 to the detachment position (hereinafter, referred to as "detachment side direction"). The side wall rear portion projection 253 has a three-dimensional shape which is symmetrical with a symbol "Ǝ" when the symbol "Ǝ" is reflected in a mirror and seen from behind.

As illustrated in FIG. 1, the lid body 3 has a substantially rectangular shape which, substantially matches the shape of the opening circumferential portion 28 of the container main body 2. The lid body 3 is removably attached to the opening circumferential portion 28 of the container main body 2. By the lid body 3 being attached to the opening circumferential portion 28, the lid body 3 can close the container main body opening portion 21. At a circumferential edge portion of the lid body 3, a sealing member fitting groove is formed along the circumferential edge portion of the lid body 3. As illustrated in FIG. 1, a ring-like sealing member 4 that may be made of elastically deformable POE (polyoxyethylene) or PEE, or alternatively made of various types of thermoplastic elastomer such as polyester and polyolefin, fluorine containing rubber, silicon rubber, etc., is fit into the sealing member fitting groove. The sealing member 4 is arranged so as to go around the circumferential edge portion of the lid body 3.

When the lid body 3 is attached to the opening circumferential edge portion 28, the circumferential edge portion of the lid body 3 abuts with an inner circumferential portion of the opening circumferential portion 28 of the container main body 2 via the sealing member 4. With such a configuration, the sealing member 4 is sandwiched to be elastically deformed between the circumferential edge portion of the lid body 3 and the inner circumferential edge portion of the opening circumferential portion 28, and thus the lid body 3 closes the container main body opening portion 21 in an air tight state. By the lid body 3 being removed from the opening circumferential portion 28, it is possible to load or unload the substrates W relative to the substrate storing space 27 in the container main body 2.

A latching mechanism is provided at the lid body 3. The latching mechanism is provided in the vicinity of both left and right ends of the lid body 3. As illustrated in FIG. 1, the latching mechanism includes two upper side latch portions 32A which can project from the upper side of the lid body 3 in the upper direction D21 and two lower side latch portions (not illustrated) that can project from the lower side of the lid body 3 in the lower direction D22. The two upper side latch portions 32A are arranged in the vicinity of both left and right ends of the upper side of the lid body 3 and the two lower side latch portions are arranged in the vicinity of both left and right ends of the lower side of the lid body 3.

An operation portion 33 is provided at an outer face of the lid body 3. By operating the operation portion 33 from the front side of the lid body 3, it is possible to cause the upper side latch portion 32A and the lower side latch portion (not illustrated) to project from the upper side and the lower side of the lid body 3 as well as possible to make enter a state not projecting from the upper side and the lower side of the lid body 3. By the upper side latch portion 32A projecting from the upper side of the lid body 3 in the upper direction D21 to engage with the latch engagement concave portions 231A and 231B of the container main body 2 and the lower side latch portion projecting from the lower side of the lid body 3 in the lower direction D22 to engage with the latch engagement concave portions 241A and 241B of the container Main body 2, the lid body 3 is fixed to the opening circumferential portion 28 of the container main body 2.

A concave portion (not illustrated) which concave outwardly from the substrate storing space 27 is formed inside the lid body 3. In the concave portion (not illustrated), a front retainer (not illustrated) is provided and fixed.

The front retainer includes a front retainer substrate receiving portion (not illustrated). The front retainer substrate receiving portion is arranged in two pieces to be spaced apart by a predetermined interval in the left/right direction D3 so as to form a pair. The front retainer substrate receiving portions arranged in two pieces so as to form a pair as above are provided such that twenty-five pieces thereof are arranged in parallel in the upper/lower direction D2. By the substrates W being stored in the substrate storing space 27 and the lid body 3 being closed, the front retainer substrate receiving portion, sandwiches and supports end edges of the edge portions of the substrates W.

Since a pair of the handling members 8 has the identical shape, one handling member 8 will be described only here.

As illustrated in FIG. 2A, etc., the handling member 8 includes a handling member main body 81, a rib 82, a weight portion 83, a position-restriction through hole 84, a guide rail 86 as a handling-member-side guided inner part and a groove engagement portion, and a plate-like portion through hole 87 as a back side engaged portion (refer to FIG. 2C). The handling member main body 81 has a plate-like shape with a size that can cover substantially the entire face of the side wall 25, and a substantially center portion of the handling member main body 81 in the forward/backward direction D1 has a constriction portion 811 at which concave portions which are concave in the upper/lower direction, respectively, are formed.

As illustrated in FIG. 29, portions of both left and right ends of the constriction portion 811 are curved toward a direction to the side wall 25 (the right direction D3) so as to become closer to the side wall 25. Therefore, the constriction portion 811 is located closer to the side wall 25 than the front portion of the handling member main body 81. Furthermore, an inner convex portion 812 that projects toward the side wall 25 is provided on a face of the constriction portion 811 facing the side wall 25 pair of the inner convex portions 812 is provided vertically with the rib 82 as a center.

The rib 82 is provided at a center location of the handling member main body 81 in a direction orthogonal to the moving direction, i.e. at a center location of the handling member main body 81 in the upper/lower direction D2. The rib 82 is provided in a linear manner in parallel with the moving direction (the forward/backward direction. D1) from the front end to the rear end of the handling member main body 81 in the forward/backward direction D1 on the outer face opposite the inner face of the handling member main body 81 facing the side wall 25.

The rib 82 projects so as to be spaced apart from the outer face of the handling member main body 81. As illustrated in FIG. 2A, etc., at the rib 82, a plurality of rectangular spaces 821 is formed when viewed from a lateral side. A rib wall portion 822 is provided which extends in the upper/lower direction between adjacent spaces 821. Furthermore, a V-shaped concave portion 823 (refer to FIG. 2B) which is concave in a V-shape in a direction toward the side wall 25 is formed at a portion of the rib 82 located at the constriction portion 811. By a lower portion of the rib 82 being supported by a fork lift (not illustrated), it is possible to lift the substrate storing container 1 by the fork lift.

As illustrated in FIG. 2B, the weight portion 83 is configured by a portion at the rear side of the handling member main body 81 more than the constriction portion 811 of the handling member main body 81. The weight portion 83 is configured such that the portion at the rear side of the handling member main body 81 more than the constriction portion 811 thereof is thicker. The side of the handling member main body 81 facing the outer face of the side wall 25 is made thicker. Therefore, the portion of the weight portion 83 of the handling member main body 81 is configured to be thicker in a direction approaching the side wall 25 more than the other portions of the handling member main body 81 and projects in the same direction.

When the handling member 8 is located at the mounting position (refer to FIG. 7A) at which it is mounted and fixed to the side wall 25, as illustrated in FIG. 7C, the weight portion 83 faces a portion at the back side of the back portion outer face depression portion 254 and is fitted into a depressed space formed at the portion at the back side of the back portion outer face depression portion 254 in a state of being spaced apart from the back portion outer face depression portion 254.

As illustrated in FIG. 2A, the position-restriction through hole 84 is configured by a circular through hole and extends through the handling member main body 81 in the thickness direction of the handling member 8. A pair of the position-restriction through holes 84 is formed at the upper side and the lower side of the rib 82, respectively, portion in the vicinity of the front end of the handling member main body 81. The inner diameter of the position restriction through-hole 84 is slightly greater than the diameter of the semicircular convex portion 251. As illustrated in FIG. 7A, when the handling member 8 is at the mounting position (refer to FIG. 7), a pair of the semicircular convex portions 251 is engaged with a pair of the position restriction through holes 84.

Guide rib insertion holes 85 is respectively formed at portions closer to the upper end and the lower end of the handling member main body 81 more than the pair of the position restriction through-hole 84 and located at a rear side of the handling member main body 81 more than the pair of the position-restriction through holes 84. The guide rib insertion holes 85 have an elongated rectangular shape in the moving direction when viewed from a lateral side, i.e. in the forward/backward direction D1.

As illustrated in FIG. 2A, the guide rails 86 are provided at a portion more in the backward direction. D12 than the center of the guide rib insertion hole 85 in the forward/backward direction D1. The guide rails 86 have a rectangular shape when viewed from a lateral side, the length of the guide rail 86 in the forward/backward direction D1 is approximately a half the length of the guide rib insertion hole 85 in the same direction, and the width of the guide rail 86 in the upper/lower direction D2 is approximately one fourth the width of the guide rib insertion hole 85 in the same direction.

The guide rail 86 is provided so as to be the positional relationship in which a long side on a side distanced from the rib 82 among the long sides of the rectangular guide rib insertion hole 85 is equal to a long side at a side more distanced from the rib 82 of the long sides of the guide rail 86. More specifically, as illustrated in FIG. 2A, etc., the guide rail 86 is provided at a long side at the upper side of the guide rib insertion hole 85 at the guide rib insertion hole 85 on the upper side. Furthermore, the guide rail 86 is provided at a long side on the lower side of the guide rib insertion hole 85 at the guide rib insertion hole 85 on the lower side. The guide rail 86 can be engaged with the guide groove 252A which is formed by the guide rib 252 and the side wall 25. Furthermore, in a state of the guide rail 86 being engaged with the guide groove 252A, the movement is guided between the mounting position (refer to FIG. 5A) and the detachment position (refer to FIG. 7A) by the guide rib 252 and the side wall 25, which form the guide groove 252A.

As illustrated in FIG. 2E, etc., an end plate-like portion 88 is provided at an end of the handling member main body 81 in the detachment side direction (the backward direction D12), i.e. at a rear end of the handling member main body 81. The end plate-like portion 88 extends in a direction approaching from the rear end of the handling member main body 81 to the side wall 25. Therefore, the end plate-like portion 88 has a positional relationship which is orthogonal to the detachment side direction, i.e. the backward direction D12. As illustrated in FIG. 2C, the end plate-like portion 88 has an elongated plate shape that extends from the upper end to the lower end of the handling member main body 81.

As illustrated in FIG. 2C, the plate-like portion through holes 87 are formed in the end plate-like portion 88. The plate-like portion through holes 87 have a long rectangular shape in the upper/lower direction D2 and formed at a portion in the vicinity of the upper end of the end plate-like portion 88, at a portion in the vicinity of the lower end of the end plate-like portion 88, and at a center portion in the upper/lower direction D2. In order for the side wall rear portion projection 253 in a symmetrical shape with the symbol "Ǝ" to be inserted and engaged, the plate-like portion through holes 87 have vertical and horizontal lengths having values slightly greater than the vertical and horizontal values of the symbol "Ǝ".

In the substrate storing container 1 with the abovementioned configuration, the attachment/detachment of the handling member 8 is performed as follows.

As illustrated in FIGS. 4A to 4C, the handling member 8 is moved initially along the side wall 25 in the forward direction D11 from the rear side of the container main body 2. Then, with the positional relationship of the guide rib insertion hole 85 facing the guide rib 252 when viewed from a lateral side, the handling member 8 approaches the side wall 25, and, as illustrated in FIG. 5A, the guide rib 252 is inserted into the front portion of the guide rib insertion hole 85. At this moment, the position of the handling member 8 is at the detachment position.

Next, the handling member 8 is moved in the forward direction D11 with respect to the container main body 2, and, as illustrated in FIGS. 6A and 6B, the guide rails 86 are engaged with the guide grooves 252A. Then, the front end the handling member main body 81 starts to run on to the semicircular convex portion 251. Then, furthermore, as the handling member 8 is moved to the forward direction D11 with respect to the container main body 2, as illustrated in FIGS. 7A and 7B, the guide rib 252 enters the state of being located at a rear end of the guide rib insertion hole 85. At this moment, the side wall rear portion projection 253 is inserted at the same time into three plate-like portion through holes 87 at the rear portion of the handling member 8. In addition, at this moment, the semicircular convex portions 251 are engaged at the same time with the two position-restriction through holes 84. The position of the handling member 8 at this moment is the mounting position.

Due to the movement of the handling member 8 from the detachment position (refer to the FIG. 5A) to the mounting position (refer to FIG. 7A), the engagement of the guide rails 86 as the handling member side guided portion with the guide grooves 252A which is formed by the guide rib 252 and the engagement of the plate-like portion through holes 87 as the back side engaged portion with the side wall rear portion projection 253 as the back side engaging portion allows the handling member 8 to be fixed in a manner of being not movable in the upper/lower direction D2 with respect to the side wall 25. Furthermore, when the handling member 8 is located at the mounting position (refer to FIG. 7A), the engagement of the semicircular convex portions 251 with the position-restriction through holes 84 allows the handling member 8 to be fixed in a manner of being not movable in the moving direction (the forward/backward direction D1) that connects the mounting position with the detachment position with respect to the side wall 25.

When detaching the handling member 8 from the side wall 25, first, a portion in the vicinity of the plate-like portion through hole 87 of the front end of the handling member main body 81 is lifted to be bent in a distance away from the side wall 25. While maintaining this state, the handling member 8 is moved in the backward direction D12. Then, as illustrated in FIG. 5A, when the guide rail 86 is located at the front portion of the guide rib insertion hole 85, i.e. when the handling member 8 is located at the detachment position, the handling member 8 is spaced apart from the side wall 25. With such a configuration, the handling member 8 is detached from the side wall 25.

In accordance with the substrate storing container 1 according to the first embodiment with the abovementioned configuration, the following operational effect can be acquired.

As described above, the side wall 25 includes: the semicircular convex portion 251 configured so as to project from the side wall 25 in a direction away from the outer surface of the side walls 25 such that the projection amount increases as the projection approaches the mounting position from the detachment position, the guide rib 252 as a guide member which movably guides the handling member 8 between the mounting position and the detachment position; and the side wall rear portion projection 253 as a back side engaging portion formed at the back side of the side wall 25. Then, the portion 251A at which the projection amount of the semicircular convex portion 251 is the minimum is located at a position which is the closest to the detachment position of the semicircular convex portion 251, and the portion 251B at which the projection amount of the semicircular convex portion 251 is the maximum is located at a position which is the closest to the mounting position of the semicircular convex portion 251.

Furthermore, the handling member 8 includes a substantially plate-like handling member main body 81 arranged along the side wall 25, a circular position-restriction through hole 84 which is formed to extend through the handling member main body 81 in the thickness direction of the handling member 8, and which is capable of being engaged by the semicircular convex portion 251, a guide rail 86 as a handling member side guided portion which engages with the guide groove 252A formed by the guide rib 252 as a guide member, and which has the movement thereof guided between the mounting position and the detachment position by the guide member (the guide rib 252), and the plate-like portion through hole 87 as a back side portion which is capable of being engaged with the back side engaging portion (the side wall rear portion projection 253) due to the movement of the handling member 8 from the detachment position (refer to FIG. 5A) to the mounting position (refer to FIG. 7A).

Therefore, the engagement of the guide rail 86 with the guide groove 252A and the engagement of the side wall rear portion projection 253 with the plate-like portion through hole 87 allows the handling member 8 to be fixed in a manner of being not movable in the upper/lower direction D2 with respect to the side wall 25. Furthermore, along with this, the engagement of the semicircular convex portion 251 with the position-restriction through hole 84 allows the handling member 8 to be fixed in a manner of being not movable in the moving direction that connects the mounting position with the detachment position with respect to the side wall 25.

More specifically, since the engagement/releasing the engagement of the semicircular convex portion 251 with the position restriction through hole 84 is performed by bending the portion of the plate-like handling member main body 81 at which the position-restriction through hole 84 is formed, this portion can be configured so as to be not likely to be damaged. As a result, it is possible to lock the handling member 8 at the side wall 25 that constitutes a part of the wall portion 20 and provide the substrate storing container 1 which hardly receives damage to the configuration for locking the handling member 8 at the side wall 25.

Furthermore, since the semicircular convex portion 251 is engaged with the circular position-restriction through hole 84, it is possible to suppress rattling occurring between the side wall 25 and the handling member main body 81 in the upper/lower direction D2 as well as in the moving direction. Furthermore, it is possible to easily and smoothly perform the engagement of the semicircular convex portion 251 with the circular position-restriction through hole 84. Furthermore, it is possible to reduce a portion to be worn out which can improve its durability.

Furthermore, since the portion 251A at which the projection amount of the semicircular convex portion 251 is the minimum is located at a position which is the closest to the detachment position of the semicircular convex portion 251 and the portion 251B at which the projection amount of the semicircular convex portion 251 is the maximum is located at a position which is the closest to the mounting position of the semicircular convex portion 251, it is possible for the portion of the handling member main body 81 at which the position-restriction through hole 84 is formed to easily run over to the semicircular convex portion 251, a result of which it is possible to facilitate the engagement of the semicircular convex portion 251 with the position-restriction through hole 84.

Furthermore, the back side portion of the side wall 25 includes the back portion outer face depression portion 254 at which outer faces of a pair of the side walls 25 are depressed along the circumferences of the substrates W stored in the substrate storing space 27, respectively. Then, the handling member 8 has the weight portion 83 that allows the back portion outer face depression portion 254 to be fit, at the portion of the handling member main body 81 upon being located at the mounting position (refer to FIG. 7A) and facing the back portion outer face depression portion 254. With such a configuration, it is possible to appropriately balance the weight between the front and the rear of the substrate storing container 1 even when the weight of the lid body 3 is great. Moreover, it is possible to prevent the weight portion 83 from greatly projecting outwardly out of the substrate storing container 1.

Furthermore, the weight portion 83 is configured such that the handling member main body 81 becomes thick toward the side at which a pair of the handling members 8 faces the outer face of the side wall 25. Due to this, the weight portion 83 can be arranged to be a simple configuration, a result of which it is possible to reduce the cost for the overall substrate storing container 1.

The guide member has a pair of the guide grooves 252A formed at the side wall 25 to be open in the upper direction D21 and the lower direction D22, respectively, and extending in the moving direction. Then, the handling member side guided portion is configured by the guide rail 86 as a pair of the groove engagement portion that can be engaged with the guide groove 252A and extends in the moving direction.

With such a configuration, it is possible to guide the movement of the guide rail 86 as a handling member side guided portion stably and linearly between the mounting position (refer to FIG. 7A) and the detachment position (refer to FIG. 5A) by the guide groove 252A. Furthermore, since the guide rail 86 as a groove engagement portion extending in the moving direction is engaged with the guide groove 252A extending in the moving direction when the handling member 8 is located at the mounting position, it is possible to apply load of the container main body 2 and the lid body 3 to the guide groove 252A and the guide rail 86 extending in the moving direction when the rib 82 is lifted by the fork lift. Therefore, as compared with a case in which a load is applied to a small member such as a locking hook, it is possible to make the configuration of fixing the handling member 8 to the side wall 25 to be not likely to be damaged.

The back side portions of a pair the side walls 25 have the back portion outer face depression portions 254 at which outer faces of a pair of the side walls 25 are depressed along the circumferences of the substrates W stored in the substrate ring space 27, respectively. Then, the back side engaging portion is configured by the side wall rear portion projection 253 as a projecting portion that projects from the outer face of the back side outer face depression portion 254 in the detachment side direction (the backward direction D12) toward the detachment position from the mounting position. Furthermore, the end of the handling member main body 81 in the detachment side direction (the backward direction D12) has the end plate-like portion 88 that is orthogonal to the detachment side direction. Then, the back side engaged portion is configured by the plate-like portion through hole 87 which is formed at the end plate-like portion 88 so as to extend through the end plate-like portion 88 and with which the projecting portion is engaged.

Due to this, by moving the handling member 8 to the mounting position (refer to FIG. 7A), it is possible to engage the side wall rear portion projection 253 with the plate-like portion through hole 87 reliably. Furthermore, since the handling member 8 is fixed firmly to the side wall 25 due to the plate-like portion through hole 87 being engaged with the side wall rear portion projection 253, it is possible to suppress the side wall rear portion projection 253 from being damaged as much as possible when the rib 82 is lifted by a fork lift.

Furthermore, the handling member 8 has the rib 82 that extends in parallel in the moving direction (the forward/backward direction D1) in the center portion of the handling member main body 81 in a direction orthogonal to the moving direction (the upper/lower direction D2). Due to this, it is possible to use the rib 82 for improving the strength of the handling member 8 by lifting the substrate storing container 1 by a fork lift.

Figure 8:
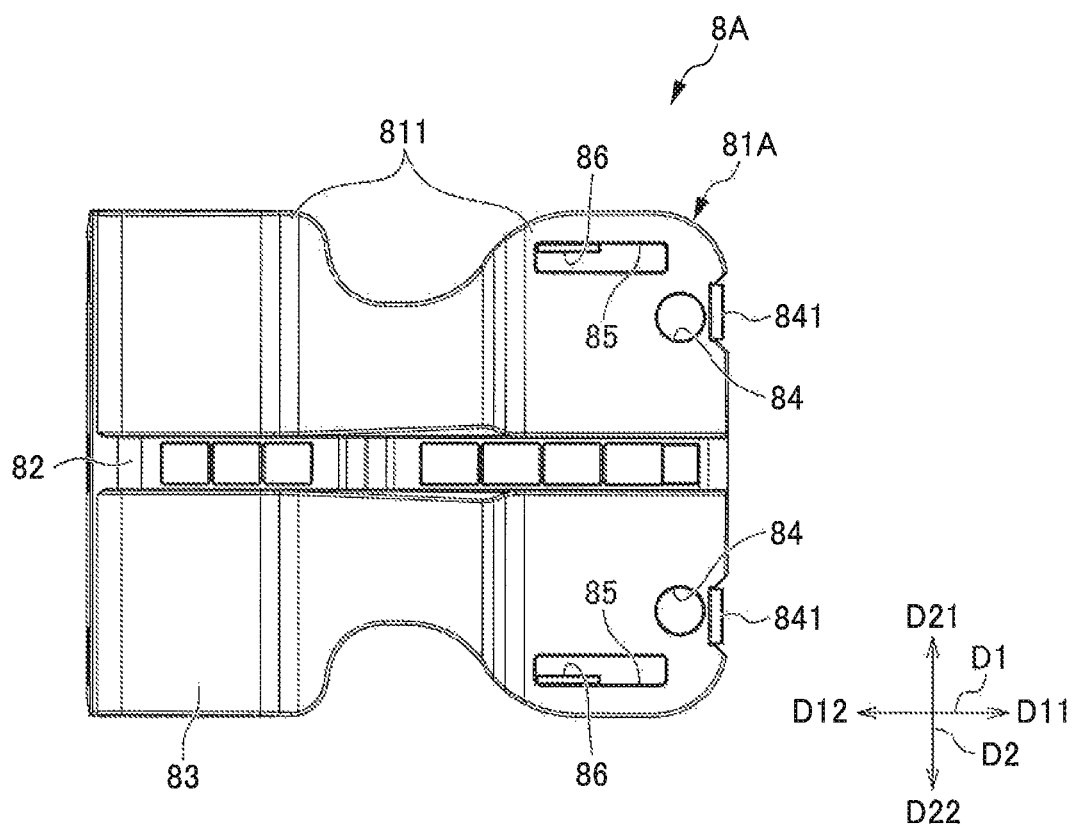
FIG. 8 is a lateral view illustrating a handling member 8A of a substrate storing container according to the second embodiment of the present invention.
Figure 9:
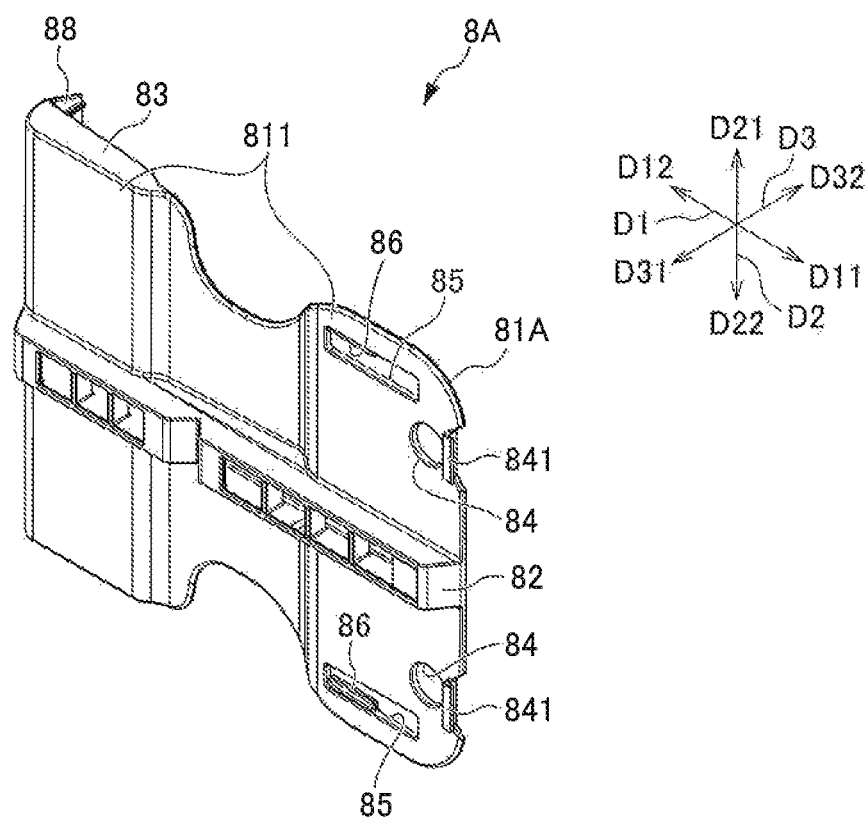
FIG. 9 is a perspective view illustrating the handling member 8A of the substrate storing container according to the second embodiment of the present invention.

In the following, a substrate storing container according to the second embodiment of the present invention will be described. FIG. 8 is a lateral view illustrating a handling member 8A of a substrate storing container according to the second embodiment of the present invention. FIG. 9 is a perspective view illustrating a handling member 8A of a substrate storing container according to the second embodiment of the present invention.

In the second embodiment, the handling member 8A is different from the first embodiment in that the second embodiment has a picking portion 841 for detachment that can facilitate detachment of the handling member 8A to the side wall 25. Since the configurations other than this configuration are the same as those of the first embodiment, the same reference numerals are used for the same members and explanations thereof will be omitted.

The picking portion 841 for detachment is provided in the vicinity of the position-restriction through hole 84 at the front end of the handling member main body 81A. Regarding the picking portion 841 for detachment, as illustrated in FIGS. 8 and 9, a front end of the handling member main body 81A is configured to project in a direction away from the side wall 25 in a rectangular shape when viewed from a lateral side.

With the substrate storing container according to the second embodiment of the abovementioned configuration, since the picking portion 841 for detachment is provided, it is possible to easily bend a portion of the handling member main body 81A at which the position restriction through hole 84 is formed in a direction away from the side wall 25 (the left direction D31), and thus the engagement/releasing of the engagement of the semicircular convex portion 251 with the position-restriction through hole 84 can be easily performed.

The present invention is not limited to the abovementioned embodiments, and modifications thereto within the technical scope claimed in the claims are possible. For example, the shape and the configuration of the substrate storing container 1 are not limited to the shapes and the configurations of the abovementioned embodiments. More specifically, for example, although the end plate-like portion 88 is orthogonal to the detachment side direction (the backward direction D12), the present invention is not limited thereto, and may have a positional relationship of intersecting.

Similarly, the guide member of the side wall, the back side engaging portion, the handling member side guided portion of the handling member, the back side guided portion, etc., are not limited to the shapes of the present embodiments. Any guide member is acceptable so long as it can movably guide the handling member between the mounting position and the detachment position, and any back side engaging portion is accepted so long as it is formed at a back side of a pair of the side walls. Furthermore, any handling member side guided portion is acceptable so long as it is configured to be engaged with the guide member so as to guide the movement between the mounting position and the detachment position by the guide member, and any back side engaged portion is acceptable so long as it can be engaged with the back side engaging portion by the movement of the handling member from the detachment position to the mounting position.

EXPLANATION OF REFERENCE NUMERALS 1 substrate storing container
2 container main body
3 lid body
8 handling member
20 wall portion
21 container main body opening portion
22 back wall
23 upper wall
24 lower wall
25 first side wall
26 second side wall
27 substrate storing space
81 handling member main body
82 rib
83 weight portion
84 position-restriction through hole
86 guide rail (handling member side guided portion, groove engagement portion)
87 plate-like portion through hole (back side engaged portion)
251 semicircular convex portion
253 side wall rear portion projection (back side engaging portion, projecting portion)
W substrate

The invention claimed is:

1. A substrate storing container comprising:
a container main body including a tubular wall portion with a container main body opening portion formed at one end and the other end closed, the wall portion having a back wall, an upper wall, a lower wall, and a pair of side walls, the container main body opening portion being formed by one end of the upper wall, one end of the lower wall, and one end of each of the side walls, wherein a substrate storing space that can store a plurality of substrates and is in communication with the container main body opening portion is formed by an inner face of the upper wall, an inner face of the lower wall, inner faces of the side walls, and an inner face of the back wall;
a lid body that is removably attached to the container main body opening portion and can close the container main body opening portion; and
a pair of handling members that is arranged to face outer faces of the pair of the side walls, respectively, and can move between a mounting position and a detachment position along each side wall of the pair of the side walls, wherein the pair of the handling members is configured to be mounted to each of the side walls by moving to the mounting position and is detached from each of the side walls by moving to the detachment position,
wherein the side wall includes: a semicircular convex portion in semicircular shape that is configured so that a projection amount becomes greater gradually as the semicircular convex portion projects from the side wall in a direction distancing from an outer face of the side wall, and approaches the mounting position from the detachment position; a guide member that movably guides each handling member of the pair of the handling members between the mounting position and the detachment position; and a back side engaging portion that is formed at a back side of each side wall of the pair of the side walls, wherein a portion at which a projection amount of the semicircular convex portion is a minimum is located at a position which is the closest to the detachment position of the semicircular convex portion, and a portion at which a projection amount of the semicircular convex portion is a maximum is located at a position which is the closest to the mounting position of the semicircular convex portion, wherein the handling member includes: a handling member main body that is arranged along each side wall of the pair of the side walls, respectively; a circular position-restriction through hole that is formed to extend through the handling member main body in a thickness direction of the handling member and with which the semicircular convex portion can be engaged; a handling member side guided portion that is engaged with a guide member and of which a movement is guided between the mounting position and the detachment position by the guide member; and a back side guided portion that can be engaged with the back side engaging portion by a movement of the handling member from the detachment position to the mounting position, and wherein engagement of the handling member side guided portion with the guide member and engagement of the back side guided portion with the back side engaging portion allows the handling member to be fixed in a manner of being not movable in upward or downward directions with respect to the side wall, and engagement of the semicircular convex portion with the position-restriction through hole allows the handling member to be fixed in a manner of being not movable in a movement direction that connects the mounting position with the detachment position with respect to the side wall.

2. The substrate storing container according to claim 1,
wherein a substrate of the plurality of substrates is stored in the substrate storing space in a positional relationship in which an upper face and a lower face of the substrate become substantially horizontal;
a back side portion of the pair of the side walls has a back portion outer face depression portion at which outer faces of the pair of the side walls are depressed along circumferential edges of the plurality of the substrates stored in the substrate storing space, respectively; and
the pair of the handling members respectively includes a weight portion that can be fit to the back portion outer face depression portion at a portion of the handling member main body when the pair of the handling members is located at the mounting position and facing the back portion outer face depression portion.

3. The substrate storing container according to claim 2,
wherein the weight portion is configured such that the handling member main body becomes thicker toward a side at which the pair of the handling members faces an outer face of the side wall.

4. The substrate storing container according to claim 1,
wherein the guide member has a pair of guide grooves that is formed at the side wall and open to an upper direction and a lower direction, respectively, to extend in the moving direction; and
the handling member side guided portion is configured by a pair of groove engagement portions that can be engaged with each guide groove of the pair of guide grooves and extends in the moving direction.

5. The substrate storing container according to claim 1,
wherein the substrate is stored in the substrate storing space in a positional relationship in which an upper face and a lower face of the substrate become substantially horizontal;
a back side portion of the pair of the side walls has a back portion outer face depression portion at which outer faces of the pair of the side walls are depressed in a stepwise manner along circumferential edges of the plurality of substrates stored in the substrate storing space, respectively; and
the back side engaging portion is configured by a projecting portion that projects from an outer face of the back portion outer face depression portion in a detachment side direction from the mounting position to the detachment position,
an end of the handling member main body in the detachment side direction is orthogonal to the detachment side direction and has an end portion that extends in a direction approaching the side wall, and
the back side guided portion is configured by a plate portion through hole that is formed at the end portion, formed to extend through the end portion, and with which the projecting portion can be engaged.

6. The substrate storing container according to claim 1,
wherein the handling member includes a rib that extends in parallel in the moving direction at a center portion of the handling member main body in a direction orthogonal to the moving direction, and
the substrate storing container is lifted by a fork lift by the rib being supported by a fork of the fork lift.

* * * * *